(12) United States Patent
Hori et al.

(10) Patent No.: US 11,712,748 B2
(45) Date of Patent: *Aug. 1, 2023

(54) METHOD FOR PRODUCING LIQUID-COOLED JACKET

(71) Applicant: NIPPON LIGHT METAL COMPANY, LTD., Tokyo (JP)

(72) Inventors: Hisashi Hori, Shizuoka (JP); Nobushiro Seo, Shizuoka (JP); Kosuke Yamanaka, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 588 days.

This patent is subject to a terminal disclaimer.

(21) Appl. No.: 16/624,256

(22) PCT Filed: Jul. 20, 2018

(86) PCT No.: PCT/JP2018/027338
§ 371 (c)(1),
(2) Date: Dec. 18, 2019

(87) PCT Pub. No.: WO2019/064849
PCT Pub. Date: Apr. 4, 2019

(65) Prior Publication Data
US 2020/0164462 A1    May 28, 2020

(30) Foreign Application Priority Data

Sep. 27, 2017  (JP) ................. 2017-185942

(51) Int. Cl.
*B23K 20/00*  (2006.01)
*B23K 20/12*  (2006.01)
(Continued)

(52) U.S. Cl.
CPC ...... *B23K 20/1255* (2013.01); *B23K 20/1265* (2013.01); *B23K 20/123* (2013.01);
(Continued)

(58) Field of Classification Search
CPC ............. B23K 20/1255; B23K 20/126; B23K 2101/14; B23K 20/122; B23K 20/1265;
(Continued)

(56) References Cited

U.S. PATENT DOCUMENTS

| 5,726,964 A | 3/1998 | Van Kesteren et al. |
| 5,739,937 A | 4/1998 | Liedenbaum et al. |

(Continued)

FOREIGN PATENT DOCUMENTS

| CA | 2 884 230 A1 | 3/2014 |
| CN | 1462220 A | 12/2003 |

(Continued)

OTHER PUBLICATIONS

KR 20110088266 computer English translation (Year: 2010).*

(Continued)

*Primary Examiner* — Erin B Saad
(74) *Attorney, Agent, or Firm* — Merchant & Gould P.C.

(57) ABSTRACT

Provided is a method for manufacturing a liquid-cooled jacket, to reduce the size of a recessed groove on a surface of a metal member and also to reduce roughness of a jointed surface. The method includes: a placing step of placing a sealing body on a jacket body, a first main joining step of performing friction stirring by moving a main joining rotary tool around to a first overlapped portion, and a second main joining step of performing friction stirring to a second overlapped portion. The main joining rotary tool has a base-end-side pin and a tip-end-side pin. A taper angle of the base-end-side pin is greater than a taper angle of the tip-end-side pin and a stairs-like pin step portion is formed on an outer circumferential surface of the base-end-side pin.

12 Claims, 26 Drawing Sheets

(51) Int. Cl.
  *B23K 101/04* (2006.01)
  *B23K 103/04* (2006.01)
(52) U.S. Cl.
  CPC ...... *B23K 20/125* (2013.01); *B23K 2101/045* (2018.08); *B23K 2103/04* (2018.08)
(58) Field of Classification Search
  CPC ............ B23K 20/129; B23K 2101/045; B23K 2103/10; B23K 20/1225; B23K 20/1235; B23K 20/123; B23K 20/124; B23K 2101/36; B23K 20/12; B23K 20/2336; B23K 2101/04; B23K 2101/18; B23K 2103/18; B23K 20/1245; B23K 20/127; B23K 20/227; B23K 20/24; B23K 2101/06; B23K 2103/05; B23K 31/125; B23K 33/006; B23K 37/0235; B23K 37/0531
  See application file for complete search history.

(56) References Cited

U.S. PATENT DOCUMENTS

| | | | |
|---|---|---|---|
| 6,305,866 B1 | 10/2001 | Aota et al. | |
| 6,325,273 B1 | 12/2001 | Boon et al. | |
| 6,421,578 B1 | 7/2002 | Adams et al. | |
| 6,669,075 B2 | 12/2003 | Colligan | |
| 7,275,675 B1* | 10/2007 | Carter ................ | B23K 20/1255 228/2.1 |
| 7,494,040 B2* | 2/2009 | Babb .................... | B23K 20/227 228/2.1 |
| 7,857,192 B2* | 12/2010 | Nagano .............. | B23K 20/1255 228/2.1 |
| 8,434,661 B2* | 5/2013 | Hovanski ........... | B23K 20/1255 228/2.1 |
| 10,569,356 B1 | 2/2020 | Coffey et al. | |
| 10,835,989 B2 | 11/2020 | Werz et al. | |
| 11,059,125 B2* | 7/2021 | Rosal ................. | B23K 20/1255 |
| 11,141,812 B2 | 10/2021 | Ikeda et al. | |
| 11,185,945 B2 | 11/2021 | Hori et al. | |
| 11,185,946 B2 | 11/2021 | Hori et al. | |
| 11,413,700 B2 | 8/2022 | Hori et al. | |
| 11,419,237 B2 | 8/2022 | Hori et al. | |
| 2002/0000461 A1 | 1/2002 | Jogan | |
| 2003/0024965 A1 | 2/2003 | Okamura et al. | |
| 2003/0209588 A1 | 11/2003 | Colligan | |
| 2004/0108359 A1 | 6/2004 | Hashimoto et al. | |
| 2005/0246884 A1* | 11/2005 | Chen ................... | B23K 33/004 29/525 |
| 2006/0086775 A1 | 4/2006 | Trapp et al. | |
| 2006/0151576 A1 | 7/2006 | Akiyama et al. | |
| 2006/0289608 A1 | 12/2006 | Steel et al. | |
| 2007/0241163 A1* | 10/2007 | Valant ................ | B23K 37/0235 228/2.1 |
| 2008/0067215 A1 | 3/2008 | Gendou | |
| 2008/0154423 A1* | 6/2008 | Badarinarayan ..... | B23K 20/123 700/175 |
| 2008/0251571 A1 | 10/2008 | Burford | |
| 2009/0072007 A1 | 3/2009 | Nagano | |
| 2010/0081005 A1 | 4/2010 | Aoh et al. | |
| 2010/0282822 A1 | 11/2010 | Nagano | |
| 2011/0180587 A1 | 7/2011 | Trapp et al. | |
| 2012/0153007 A1 | 6/2012 | Sall et al. | |
| 2014/0166731 A1 | 6/2014 | Seo et al. | |
| 2014/0367452 A1 | 12/2014 | Dinda et al. | |
| 2015/0097020 A1 | 4/2015 | Rosal et al. | |
| 2015/0174697 A1 | 6/2015 | Fukuda | |
| 2015/0290739 A1 | 10/2015 | Seo et al. | |
| 2016/0325374 A1* | 11/2016 | Hori .................... | B23K 20/1235 |
| 2017/0216961 A1 | 8/2017 | Utter et al. | |
| 2018/0043465 A1 | 2/2018 | Hori | |
| 2018/0214975 A1 | 8/2018 | Werz et al. | |
| 2018/0272479 A1* | 9/2018 | Hori ................... | B23K 20/1265 |
| 2019/0039168 A1 | 2/2019 | Hori et al. | |
| 2019/0210148 A1 | 7/2019 | Luszczak et al. | |
| 2019/0283174 A1 | 9/2019 | Onose et al. | |
| 2019/0358740 A1* | 11/2019 | Hori ..................... | B23K 20/129 |
| 2020/0147718 A1* | 5/2020 | Hori .................... | B23K 20/1225 |
| 2020/0324365 A1* | 10/2020 | Hori ..................... | B23K 20/122 |
| 2020/0353557 A1 | 11/2020 | Hori et al. | |
| 2021/0053144 A1* | 2/2021 | Hori ......................... | B23P 15/26 |
| 2021/0146472 A1 | 5/2021 | Hori et al. | |
| 2021/0146473 A1 | 5/2021 | Hori et al. | |
| 2021/0213561 A1 | 7/2021 | Hori et al. | |
| 2021/0346979 A1 | 11/2021 | Hori et al. | |
| 2021/0370433 A1 | 12/2021 | Hori et al. | |

FOREIGN PATENT DOCUMENTS

| | | | |
|---|---|---|---|
| CN | 1654154 A | 8/2005 | |
| CN | 101670481 A | 3/2010 | |
| CN | 102317027 A | 1/2012 | |
| CN | 102574239 A | 7/2012 | |
| CN | 203209851 U | 9/2013 | |
| CN | 103521912 A | 1/2014 | |
| CN | 103949769 A | 7/2014 | |
| CN | 104014926 A | 9/2014 | |
| CN | 104227222 A | 12/2014 | |
| CN | 104507630 A | 4/2015 | |
| CN | 104646820 A | 5/2015 | |
| CN | 105772935 A | 7/2016 | |
| CN | 105899321 A | 8/2016 | |
| CN | 107000114 A | 8/2017 | |
| CN | 111032268 A | 4/2020 | |
| DE | 20 2012 001 704 U1 | 5/2013 | |
| DE | 10 2012 001 877 A1 | 8/2013 | |
| DE | 10 2013 000 574 A1 | 7/2014 | |
| EP | 1 400 302 A1 | 3/2004 | |
| EP | 2835209 A1 | 2/2015 | |
| JP | 11-267859 A | 10/1999 | |
| JP | 2000-246465 A | 9/2000 | |
| JP | 2001-269779 A | 10/2001 | |
| JP | 2002-346766 A | 12/2002 | |
| JP | 2003-48083 A | 2/2003 | |
| JP | 2004-314115 A | 11/2004 | |
| JP | 2006-212651 A | 8/2006 | |
| JP | 2007-160370 A | 6/2007 | |
| JP | 2008-73693 A | 4/2008 | |
| JP | 2008-279513 A | 11/2008 | |
| JP | 4210148 B2 | 1/2009 | |
| JP | 2009-297761 A | 12/2009 | |
| JP | 2010-36230 A | 2/2010 | |
| JP | 2010-201484 A | 9/2010 | |
| JP | 2012-125822 A | 7/2012 | |
| JP | 2012-218001 A | 11/2012 | |
| JP | 2013-27923 A | 2/2013 | |
| JP | 2013-39613 A | 2/2013 | |
| JP | 2015-131321 A | 7/2015 | |
| JP | 2015-131323 A | 7/2015 | |
| JP | 2016-087649 A | 5/2016 | |
| JP | 2016-87650 A | 5/2016 | |
| JP | 2016-150380 A | 8/2016 | |
| JP | 2016-215264 A | 12/2016 | |
| JP | 2017-42817 A | 3/2017 | |
| KR | 20110088266 A * | 1/2010 | ............ B23K 20/12 |
| KR | 10-2016-0071483 A | 6/2016 | |
| TW | I294810 B1 | 3/2008 | |
| WO | 2007/119343 A1 | 10/2007 | |
| WO | 2009/104426 A1 | 8/2009 | |
| WO | 2015/107716 A1 | 7/2015 | |
| WO | 2016/072211 A1 | 5/2016 | |
| WO | 2016/163214 A1 | 10/2016 | |
| WO | 2020/095483 A1 | 5/2020 | |
| WO | 2020/158081 A1 | 8/2020 | |

OTHER PUBLICATIONS

Office Action for Chinese Patent Application No. 201880029621.9, dated Dec. 17, 2020.

International Search Report for No. PCT/JP2018/027338, dated Oct. 2, 2018.

(56) References Cited

OTHER PUBLICATIONS

Search Report for European Patent Application No. 19898076.5 (dated Aug. 24, 2022).
International Search Report for No. PCT/JP2018/002207, dated Apr. 17, 2018.
International Search Report for No. PCT/JP2018/018951 dated Jun. 19, 2018.
International Search Report for No. PCT/JP2018/018966 dated Jun. 19, 2018.
International Search Report for No. PCT/JP2018/027337, dated Oct. 2, 2018.
International Search Report for No. PCT/JP2018/028833, dated Oct. 2, 2018.
International Search Report for No. PCT/JP2018/030412, dated Oct. 2, 2018.
International Search Report for No. PCT/JP2018/035949 dated Dec. 18, 2018.
International Search Report for No. PCT/JP2019/018216 dated Jul. 9, 2019.
International Search Report for No. PCT/JP2019/023829 dated Sep. 10, 2019.
International Search Report and Written Opinion for No. PCT/JP2018/035959 dated Dec. 25, 2018.
Office Action for Chinese Patent Application No. 201880053294.0 (dated Jul. 19, 2021).
Office Action for Chinese Patent Application No. 201880053448.6 (dated Mar. 3, 2021).
Office Action for Chinese Patent Application No. 201880076427.6, dated Jun. 1, 2021.
Office Action for Chinese Patent Application No. 201880081181.1 (dated May 2, 2021).
Office Action for Chinese Patent Application No. 201980035227.0 (dated Sep. 3, 2021).
Office Action for corresponding CN Application No. 201980035227.0 (dated Apr. 12, 2022).
Rejection Decision issued for Chinese Patent Application No. 201880029534.3. (dated Mar. 3, 2022).
Search Report for European Patent Application No. 18878273.4 (dated Jul. 15, 2021).

\* cited by examiner

FIG. 24
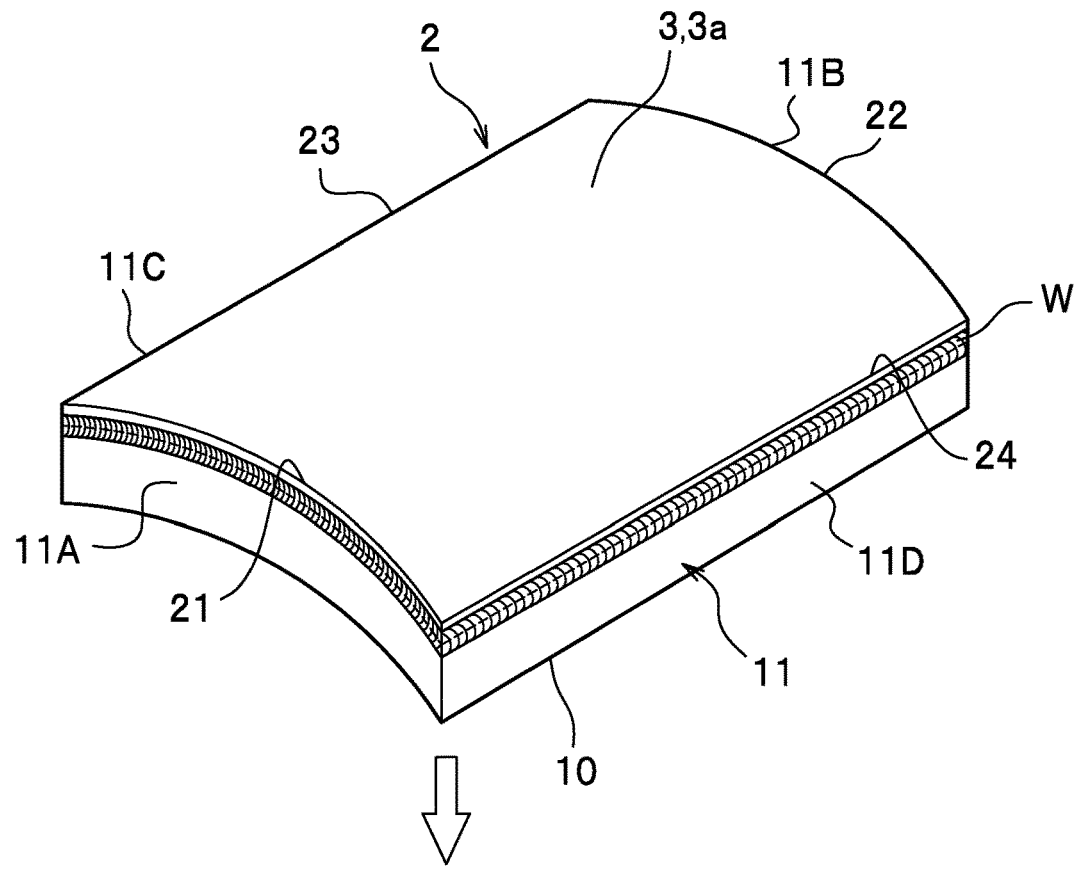
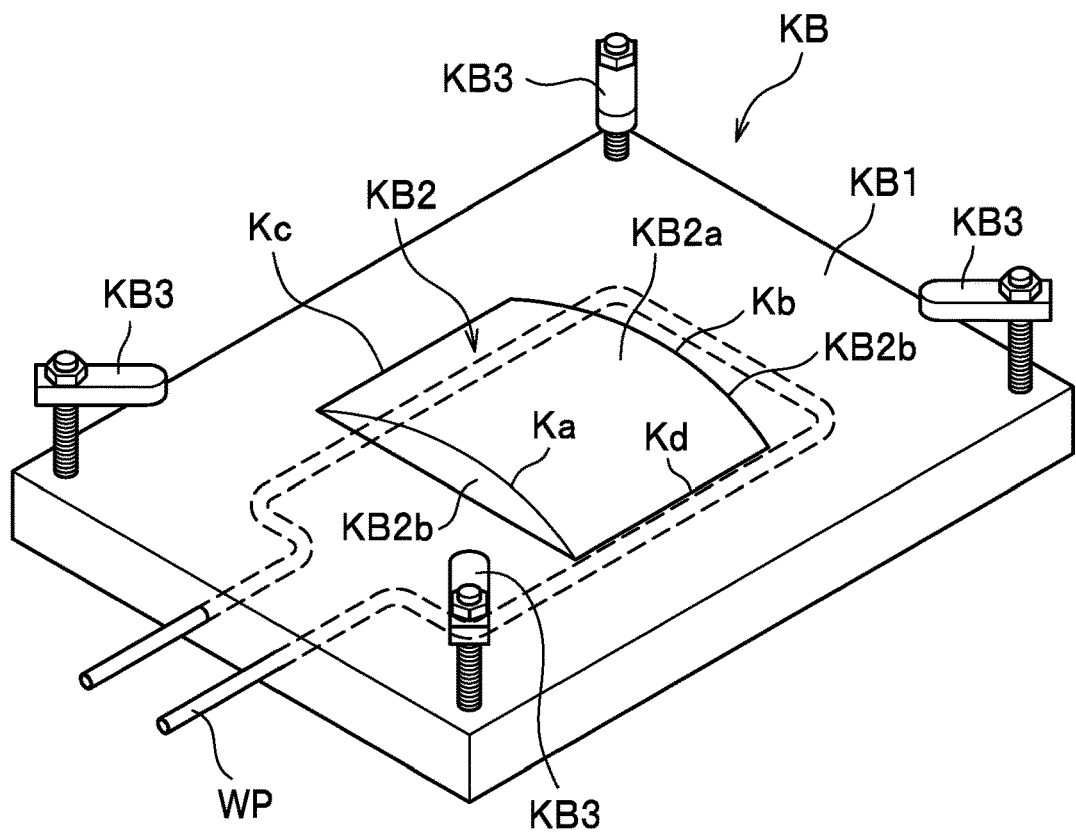

METHOD FOR PRODUCING LIQUID-COOLED JACKET

This application is a National Stage Application of PCT/JP2018/027338, filed Jul. 20, 2018, which claims benefit of priority to Japanese Patent Application No. 2017-185942, filed Sep. 27, 2017, which applications are incorporated herein by reference. To the extent appropriate, a claim of priority is made to each of the above disclosed applications.

TECHNICAL FIELD

The present invention relates to a method for producing a liquid-cooled jacket.

BACKGROUND ART

A rotary tool used for friction stir joining, including a shoulder portion and a stir pin suspended from the shoulder portion, is known. The rotary tool is also used in manufacturing a liquid-cooled jacket composed of a jacket body and a sealing body. The rotary tool is used for friction stir joining in which a lower end surface of the shoulder portion is pushed onto a metal member. By pressing the shoulder portion onto the metal member, the plastically fluidized material can be pressed to prevent the generation of burrs. However, if the height position of the joining changes, a defect is likely to occur, and there is a problem that a lot of burrs are generated and the concave groove increases in size.

Alternatively, a friction stir joining method of joining two metal members by using a rotary tool equipped with a stir pin and the method including a main joining step in which the rotating stir pin is inserted an abutted portion of the metal members and the friction stir joining is performed with only the stir pin coming in contact with a metal members, is known (Patent Document 1). According to the prior art, since a spiral groove is engraved in the outer circumferential surface of the stir pin and friction stir joining is performed under the condition that the base-end portion is exposed while contacting only the stir pin with the member to be joined, the occurrence of defects is prevented even if the height position of the joining changes, and a load in the friction stir device is reduced. However, since the plastically fluidized material is not pressed by the shoulder portion, there is a problem that the concave groove in the surface of the metal members is widened and the joined surface increases roughness. In addition, there is a problem that a bulging portion (a portion where the surface of the metal members bulges as compared with that before joining) is formed next to the concave groove.

Additionally, Patent Document 2 describes a rotary tool including a shoulder portion and a stir pin suspended from the shoulder portion. Tapered surfaces are formed on outer circumferential surfaces of the shoulder portion and the stir pin, respectively. A spiral groove in a planar view is formed on the tapered surface of the shoulder portion. The cross-sectional shape of the groove is semicircular. By providing the tapered surface, stable joining is performed even if the thickness of the metal members or the height position of joining changes. In addition, when the plastically fluidized material enters the groove, the flow of the plastically fluidized material is controlled to forma suitable plasticized area.

PRIOR ART DOCUMENT

Patent Document
Patent Document 1: Japanese Patent Application Publication No. 2013-39613
Patent Document 2: Japanese Patent No. 4210148

SUMMARY OF THE INVENTION

Problem to be Solved by the Invention

However, in the prior art of Patent Document 2, since the plastically fluidized material intrudes into the groove of the tapered surface, there is a problem that the groove does not function. In addition, when the plastically fluidized material enters the groove, the metal members to be joined is frictionally stirred with the plastically fluidized material adhered to the groove, so that there is a problem that the metal members to be joined and the adhered material rub against each other to deteriorate the joining quality. Furthermore, there is a problem that the surfaces of the joined metal members increase in roughness, burrs increase, and the concave groove in the surface of the metal members also increases in size.

From such a point of view, it is an object of the present invention to provide a method for manufacturing a liquid-cooled jacket which to allow for reducing the size of the concave groove in the surface of the metal members and reducing the joined surface in roughness.

Means for Solving the Problems

In order to solve such problems, the present invention (the first invention of the present application) is a method for manufacturing a liquid-cooled jacket configured with: a jacket body having a bottom portion, a peripheral wall portion rising from a peripheral edge of the bottom portion and a support column rising from the bottom portion; and a sealing body sealing an opening of the jacket body, wherein the jacket body and the sealing body are joined by friction stirring, the method including:

a preparation step of forming a support column end surface of the support column at the same height position as a peripheral wall end surface of the peripheral wall portion;

a placing step of placing the sealing body on the jacket body;

a first main joining step of performing friction stirring by moving a rotary tool around to a first overlapped portion where a peripheral wall end surface of the peripheral wall portion is overlapped with the back surface of the sealing body; and a second main joining step of performing friction stirring to a second overlapped portion where the support column end surface of the support column is overlapped with the back surface of the sealing body while the rotary tool is inserted from the front surface of the sealing body, wherein the rotary tool is a main joining rotary tool for friction stirring having a base-end-side pin and a tip-end-side pin, a taper angle of the base-end-side pin is greater than a taper angle of the tip-end-side pin and a stairs-like pin step portion is formed in an outer circumferential surface of the base-end-side pin, and friction stirring is performed in the first main joining step and the second main joining step under the condition that the tip-end-side pin comes in contact with both of the jacket body and the sealing body or the sealing body only and the base-end-side pin comes in contact with the sealing body.

In addition, the present invention (the second invention of the present application) is a method for manufacturing a liquid-cooled jacket configured with: a jacket body having a bottom portion, a peripheral wall portion rising from a peripheral edge of the bottom portion and a support column rising from the bottom portion; and a sealing body provided with a hole in which a tip-end of the support column is inserted and sealing an opening of the jacket body, wherein the jacket body and the sealing body are joined by friction stirring, the method including:

a preparation step of forming a support column step portion having a step bottom surface in the periphery of the tip end of the support column and a step side surface rising from the step bottom surface, and the step bottom surface of the support column at the same height position as the peripheral wall end surface of the peripheral wall;

a placing step of placing the sealing body on the jacket body;

a first main joining step of performing friction stirring by moving a rotary tool around to an overlapped portion where a peripheral wall end surface of the peripheral wall is overlapped with the back surface of the sealing body; and a second main joining step of performing friction stirring by moving the rotary tool to an abutted portion where a step side surface of the support column is abutted against a hole wall of the hole portion, wherein the rotary tool is a main joining rotary tool for friction stirring having a base-end-side pin and a tip-end-side pin, a taper angle of the base-end-side pin is greater than a taper angle of the tip-end-side pin and a stairs-like pin step portion is formed in an outer circumferential surface of the base-end-side pin, friction stirring is performed in the first main joining step under the condition that the tip-end-side pin comes in contact with either both of the jacket body and the sealing body or the sealing body only and the base-end-side pin comes in contact with the sealing body, and friction stirring is performed in the second main joining step under the condition that the tip-end-side pin and the base-end-side pin come in contact with the jacket body and the sealing body.

According to either one of the joining methods, since the sealing body is pressed by the outer circumferential surface of the base-end-side pin having a large taper angle, the concave groove in the jointed surface is reduced in size and a bulging portion formed next to the concave groove is eliminated or reduced in size. Since the stairs-like step portion is shallow and has a wide exit angle, the plastically fluidized material less likely adheres to the outer circumferential surface of the base-end-side pin even when the sealing body is pressed by the base-end-side pin. As a result, the joined surface is reduced in roughness, and the joining quality is suitably stabilized. In addition, it is easily inserted to a deep position by having a tip-end-side pin.

In the first invention of the present application, it is preferable to include a provisional joining step in which at least one of the first overlapped portion or the second overlapped portion is provisionally joined prior to the first main joining step and the second main joining step.

Additionally, in the second invention of the present application, it is preferable to include a provisional joining step in which either the abutted portion or the overlapped portion is provisionally joined prior to the first main joining step and the second main joining step.

According to this manufacturing method, performing the provisional joining in advance makes it possible to perform the first main joining step and the second main joining step stably.

Additionally, it is preferable in the preparation step to form the jacket body by die casting to have the bottom portion formed to be convex toward the front surface of the jacket body, and to form the sealing body formed to be convex toward a front surface thereof.

Although heat shrinkage may occur in the plasticized area due to the heat input by friction stir joining and the sealing body of the liquid-cooled jacket may be deformed so as to be concave inward, the liquid-cooled jacket is made flat according to this manufacturing method by making the jacket body and the sealing body convex toward the front surface in advance and utilizing heat contraction.

Furthermore, it is preferable that the deformation amount of the jacket body is measured in advance, and the friction stirring is carried out while the insertion depth of the rotary tool being adjusted to the deformation amount in the first main joining step and the second main joining step.

According to this manufacturing method, even when friction stir joining is carried out with the jacket body and the sealing body being curved in a convex shape, the length and the width of the plasticized area formed in the liquid-cooled jacket is made constant.

In addition, in the first main joining step and the second main joining step, it is preferable to dispose a cooling plate in which a cooling medium flows, on the back surface of the bottom portion and then to perform friction stirring while the jacket body and the sealing body being cooled by the cooling plate.

According to this manufacturing method, since the frictional heat is reduced to a low level, the deformation of the liquid-cooled jacket due to the thermal contraction is reduced.

In addition, it is preferable that the front surface of the cooling plate comes in surface contact with the back surface of the bottom portion. According to this manufacturing method, the cooling efficiency is enhanced.

Furthermore, it is preferable that the cooling plate has a cooling flow passage in which the cooling medium flows, and the cooling flow passage has a planar shape to follow a moving trajectory of the rotary tool in the first main joining step.

According to this manufacturing method, since the portion to be frictionally stirred is intensively cooled, the cooling efficiency is further enhanced.

In addition, it is preferable that the cooling flow passage in which the cooling medium flows is composed of a cooling pipe embedded in the cooling plate. According to this manufacturing method, the cooling medium is easily managed.

Furthermore, in the first main joining step and the second main joining step, it is preferable to carry out the friction stirring while flowing a cooling medium in a hollow portion composed of the jacket body and the sealing body to cool the jacket body and the sealing body.

According to this manufacturing method, since the frictional heat is suppressed to a low level, the deformation of the liquid-cooled jacket due to the thermal contraction is reduced. In addition, cooling may be performed using the jacket body itself without using a cooling plate or the like.

Effects of the Invention

According to the method for manufacturing a liquid-cooled jacket of the present invention, the groove on the surfaces of the metal members is reduced in size and the joined surface is reduced in roughness.

BRIEF DESCRIPTION OF THE DRAWINGS

FIG. 24 is a perspective view of the liquid-cooled jacket and the sealing body fixed to a table in the third modification of the method for manufacturing the liquid-cooled jacket according to the first embodiment.

DETAILED DESCRIPTION OF THE INVENTION

First Embodiment

A liquid-cooled jacket and a method for manufacturing the liquid-cooled jacket according to the first embodiment of the present invention will be described in details with reference to the drawings. First, a main joining rotary tool and a provisional joining rotary tool used in the present embodiment will be described.

Figure 1:
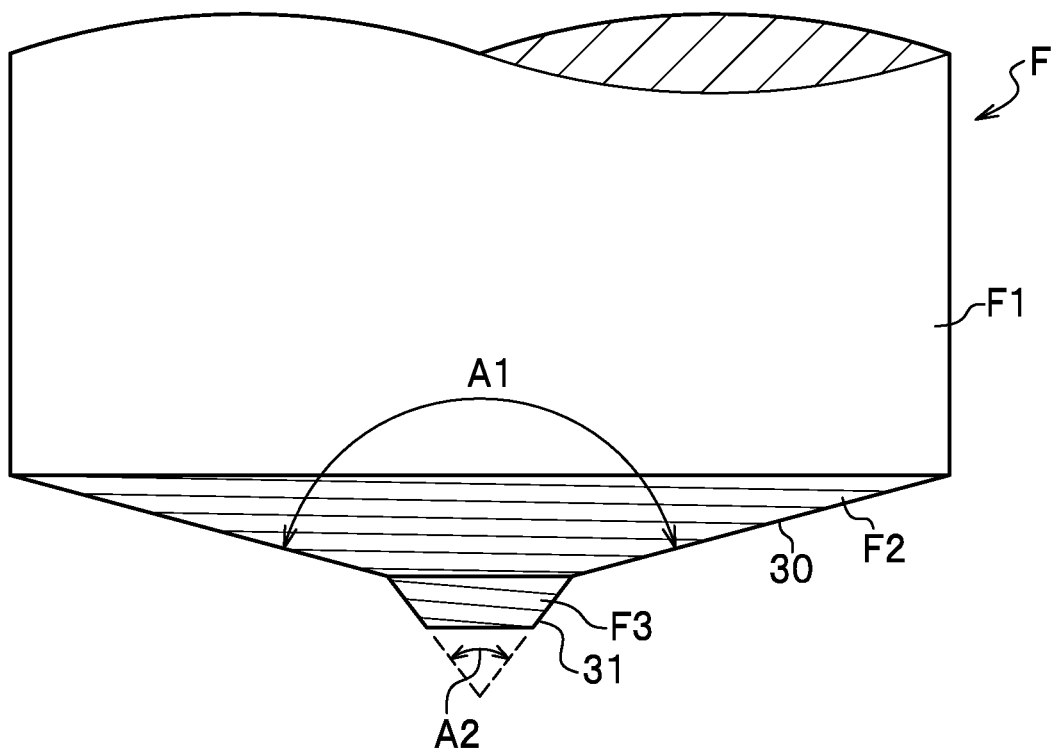
FIG. 1 is a side view of a main joining rotary tool according to an embodiment of the present invention.

As shown in FIG. 1, the main joining rotary tool F is a tool used for friction stir joining. The main joining rotary tool F is formed of a tool steel, for example. The main joining rotary tool F is mainly composed of a base portion F1, a base-end-side pin F2, and a tip-end-side pin F3. The base portion F1 has a cylindrical shape and is a portion connected to a main shaft of a friction stirring device. The rotation axis of the main joining rotary tool F may be inclined with respect to the vertical direction, but in the present embodiment, it coincides with the vertical direction. In addition, a plane perpendicular to the vertical direction is defined as a horizontal plane.

Figure 3:
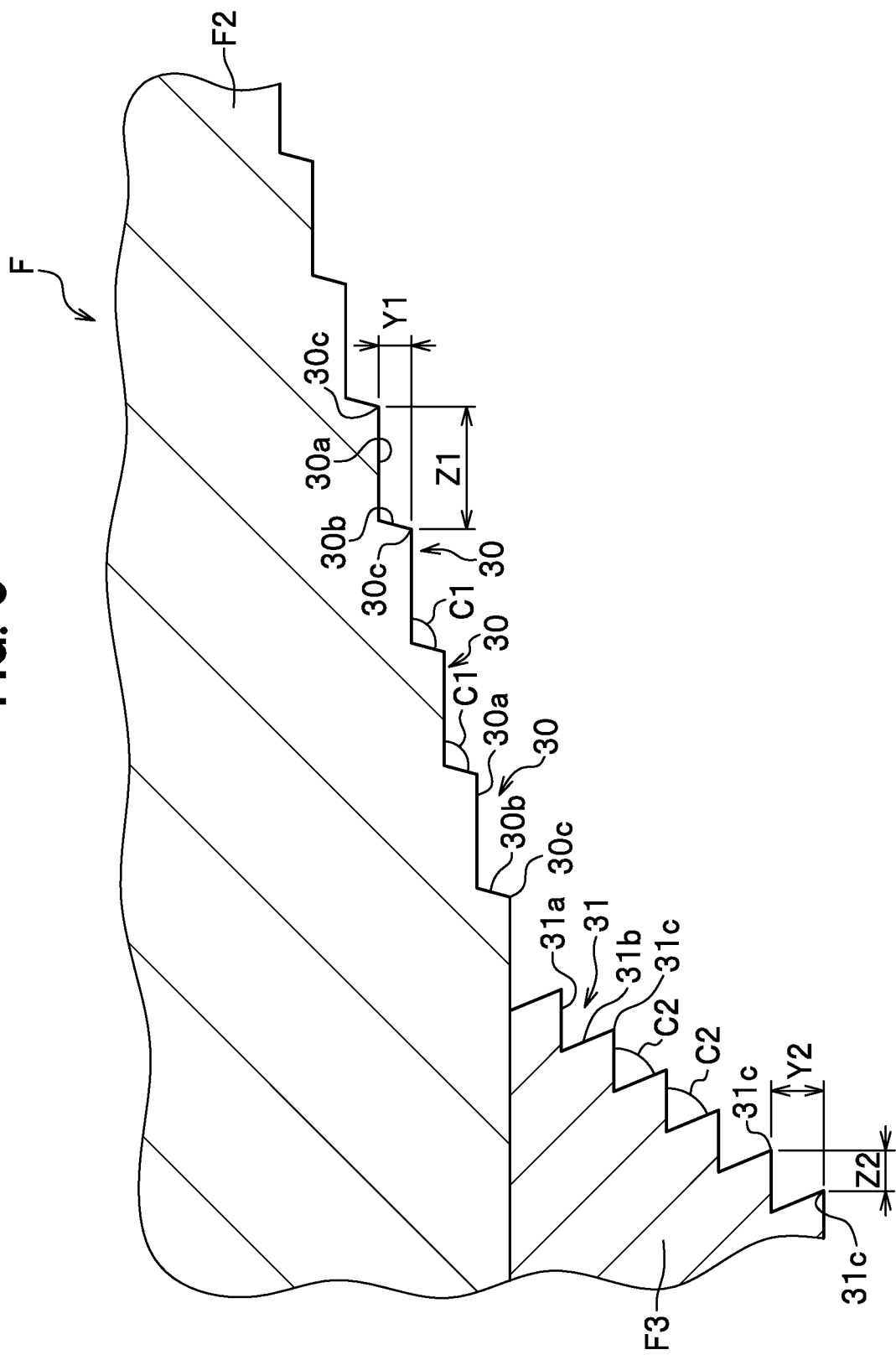
FIG. 3 is an expanded sectional view of the main joining rotary tool.

The base-end-side pin F2 is formed continuously to the base portion F1 and is tapered toward the tip. The base-end-side pin F2 has a truncated cone shape. The taper angle A1 of the base-end-side pin F2 may be set as appropriate, but is set to fall in a range of 135 to 160°, for example. When the taper angle A1 is less than 135° or exceeds 160°, joined surface increases roughness after friction stirring. The taper angle A1 is larger than the taper angle A2 of the tip-end-side pin F3 described below. As shown in FIG. 3, a stairs-like pin step portion 30 is formed on the outer circumferential surface of the base-end-side pin F2 over the entire height direction. The pin step portion 30 is formed in a spiral shape clockwise or counterclockwise. That is, the pin step portion 30 has a spiral shape in a planar view and a step shape in a side view. In the present embodiment, the pin step portion 30 is set counterclockwise from the base-end side toward the tip-end side in order to rotate the rotary tool clockwise.

Note that in the case of the main joining rotary tool F being rotated counterclockwise, it is preferable to set the pin step portion 30 clockwise from the base-end side to the tip-end side. Thereby, since a plastically fluidized material is directed toward the tip-end side by the pin step portion 30, metal overflowing to the outside of the joined metal members is reduced. The pin step portion 30 is composed of step bottom surfaces 30a and step side surfaces 30b. A distance Z1 (horizontal distance) between apexes 30c of the adjacent pin step portions 30 is appropriately set according to the step angle C1 and the height Y1 of the step side surface 30b described below.

The height Y1 of the step side surface 30b may be set as appropriate, and is set to, fall in a range of 0.1 to 0.4 mm, for example. The joined surface increases roughness when the height Y1 is less than 0.1 mm. On the other hand, when the height Y1 exceeds 0.4 mm, the joined surface tends to increase in roughness, and the number of effective step portions (the number of pin step portions 30 in contact with the joined metal members) decreases.

The step angle C1 formed by the step bottom surface 30a and the step side surface 30b may be set as appropriate, and is set fall in a range of 85 to 120°, for example. The step bottom surface 30a is parallel to the horizontal plane in the present embodiment. The step bottom surface 30a may be inclined within a range of −5° to 15° with respect to the horizontal plane from the rotation axis of the tool toward the outer circumferential direction (minus means downward with respect to the horizontal plane, and plus means upward with respect to the horizontal plane). The distance Z1, the height Y1 of the step side surface 30b, the step angle C1 and the angle of the step bottom surface 30a with respect to the horizontal plane are set as appropriate so that the plastically fluidized material is pushed out without staying in and adhering to the inside of the pin step portion 30 at the time of friction stirring, and that the plastically fluidized material is pressed by the step bottom surface 30a to reduce the joined surface in roughness.

The tip-end-side pin F3 is formed continuously to the base-end-side pin F2. The tip-end-side pin F3 has a truncated cone shape. The tip of the tip-end-side pin F3 has a flat surface. The taper angle A2 of the tip-end-side pin F3 is smaller than the taper angle A1 of the base-end-side pin F2. A spiral groove 31 is engraved on the outer circumferential surface of the tip-end-side pin F3. The spiral groove 31 may be either clockwise or counterclockwise. However, in the present embodiment, the spiral groove 31 is engraved counterclockwise from the base end toward the tip end in order to cause the main joining rotary tool F to be rotated clockwise.

Note that in the case of the main joining rotary tool F being rotated counterclockwise, the spiral groove 31 is preferably formed clockwise from the base end toward the tip end. Thereby, since the plastically fluidized material is directed toward the tip end by the spiral groove 31, the metal overflowing to the outside of the joined metal members is reduced. The spiral groove 31 is composed of a spiral bottom surface 31a and a spiral side surface 31b. The distance (horizontal distance) between the apexes 31c of the adjacent spiral grooves 31 is set to a length Z2. The height of the spiral side surface 31b is set to a height Y2. The spiral angle C2 formed by the spiral bottom surface 31a and the spiral side surface 31b falls in a range of 45 to 90°, for example. The spiral groove 31 works to raise the frictional heat by contacting the joined metal members and direct the plastically fluidized material toward the tip end side.

Figure 2:
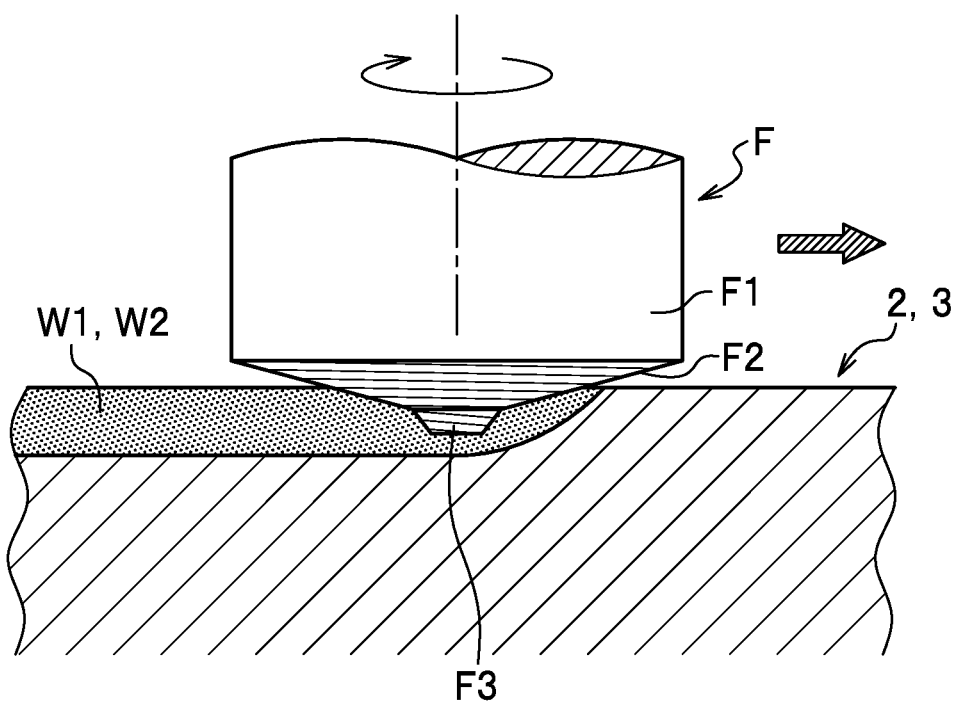
FIG. 2 is a schematic cross section in a joining operation of the main joining rotary tool.

As shown in FIG. 2, when the friction stir joining is performed using the main joining rotary tool F, the friction stir joining is performed while the surface of the joined metal members (a jacket body 2 and a sealing body 3 described below) being pressed by the outer circumferential surface of the base-end-side pin F2 of the main joining rotary tool F. The insertion depth of the main joining rotary tool F is set so that at least a part of the base-end-side pin F2 comes in contact with the surface of the joined metal members. In the moving trajectory of the main joining rotary tool F, a plasticized area W1 (or a plasticized area W2) is formed because the metal subjected to friction stirring hardens.

Figure 4:
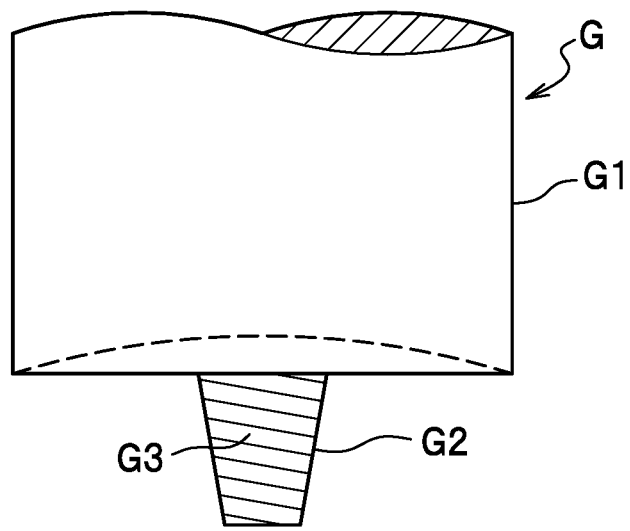
FIG. 4 is a side view of a provisional joining rotary tool according to an embodiment of the present invention.
Figure 5:
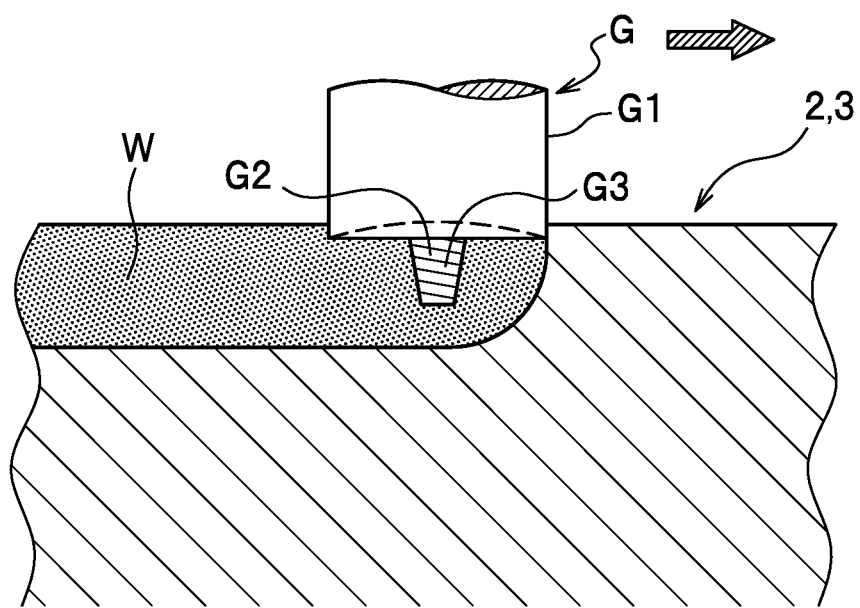
FIG. 5 is a schematic cross section of a provisional joining rotary tool in a joining operation.

As shown in FIG. 4, a provisional joining rotary tool G is composed of a shoulder portion G1 and a stir pin G2. The provisional joining rotary tool G is formed of a tool steel, for example. The shoulder portion G1 is a portion which is connected to the main shaft of the friction stir device as shown in FIG. 5 and which presses the plasticized metal. The shoulder G1 has a cylindrical shape. The lower end surface of the shoulder portion G1 is concave to prevent the fluidized metal from flowing out to the outside.

The stir pin G2 is suspended from the shoulder portion G1and is coaxial with the shoulder portion G1. The stir pin G2 is tapered as being smaller diameter with the increasing distance from the shoulder portion G1. A spiral groove G3 is engraved in the outer circumferential surface of the stir pin G2.

As shown in FIG. 5, when friction stir joining is performed using the provisional joining rotary tool G, the provisional joining rotary tool G is moved while the rotated stir pin G2 and the lower end surface of the shoulder portion G1 being inserted into the joined metal members. A plasticized area W is formed on the moving trajectory of the provisional joining rotary tool G because the metal subjected to friction stirring hardens.

Figure 6:
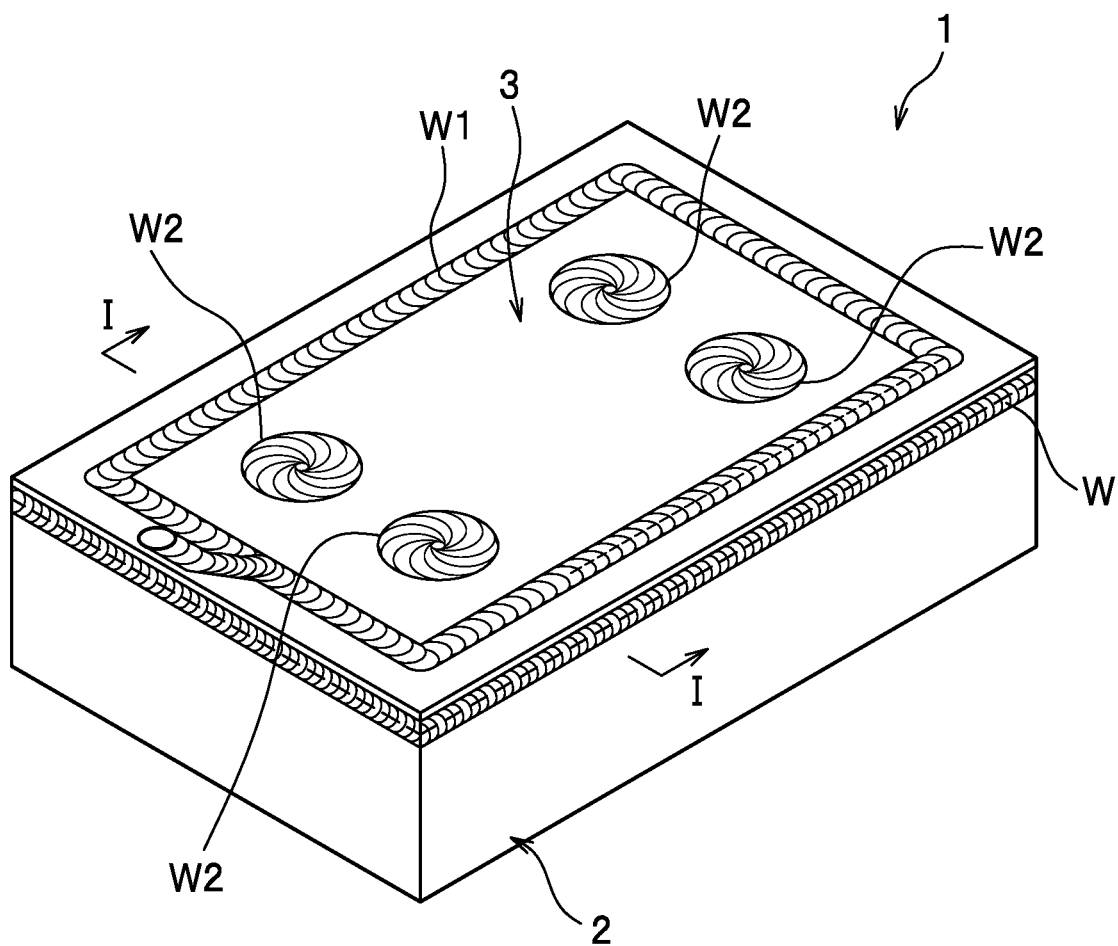
FIG. 6 is a perspective view of a liquid-cooled jacket according to a first embodiment of the present invention.

Next, the liquid-cooled jacket of the present embodiment will be described. As shown in FIG. 6, the liquid-cooled jacket 1 according to the present embodiment is composed of a jacket body 2 and a sealing body 3, and has a rectangular parallelepiped shape. The jacket body 2 and the sealing body 3 are integrated by friction stir joining. The liquid-cooled jacket 1 has a hollow portion formed therein so that a heat transferring fluid such as water may flow in the hollow portion. The liquid-cooled jacket 1 allows the heat transferring fluid to flow through the hollow portion, for example, to cool the heating element mounted to the liquid-cooled jacket 1.

Figure 7:
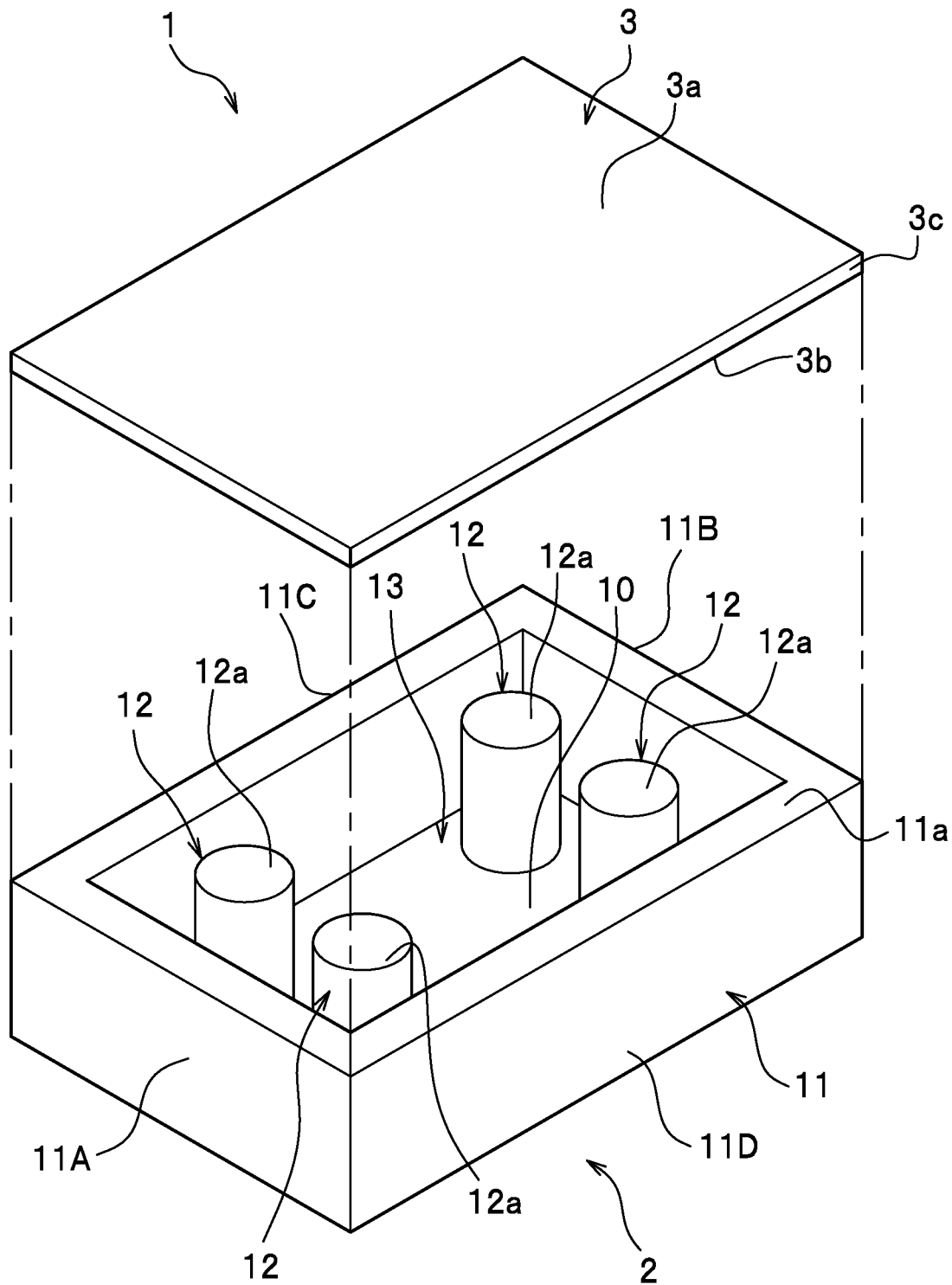
FIG. 7 is a disassembled perspective view of a liquid-cooled jacket according to the first embodiment of the present invention.

As shown in FIG. 7, the jacket body 2 is a box-like body whose upper side is opened. The jacket body 2 is configured to include a bottom portion 10, a peripheral wall portion 11, and a plurality of support columns 12. The jacket body 2 is appropriately selected from metals which can be frictionally stirred such as aluminum, aluminum alloy, copper, copper alloy, titanium, titanium alloy, magnesium and magnesium alloy. The jacket body 2 is formed of an aluminum alloy of the same material type as the sealing body 3 in the present embodiment, but an aluminum alloy cast material (for example, JIS AC4C, ADC12 or the like) may be used.

The bottom portion 10 has a rectangular plate shape in a planar view. The peripheral wall portion 11 rises from the periphery of the bottom portion 10, and has a rectangular frame shape in a planar view. The peripheral wall portion 11 is composed of wall portions 11A, 11B, 11C, and 11D having the same thickness. The wall portions 11A and 11B are short side portions and face each other. In addition, the wall portions 11C and 11D are long side portions and face each other. A recess 13 is formed inside the bottom portion 10 and the peripheral wall portion 11.

The support column 12 rises from the bottom portion 10 and has a columnar shape. The number of the support columns 12 may be any number as long as being one or more, but in the present embodiment, four support columns are formed. The shapes of the support columns 12 are all the same. The support column end surface 12a of the end surface of the support column 12 is formed at the same height position as the peripheral wall end surface 11a of the peripheral wall portion 11.

The sealing body 3 is a plate-like member which is rectangular in a planar view and seals the opening of the jacket body 2. In the present embodiment, the sealing body 3 is formed of an aluminum alloy of the same material type as the jacket body 2, but a wrought aluminum alloy material (for example, JIS A1050, A1100, A6063 etc.) may be used. The planar shape of the sealing body 3 is the same as the planar shape of the jacket body 2.

Figure 8:
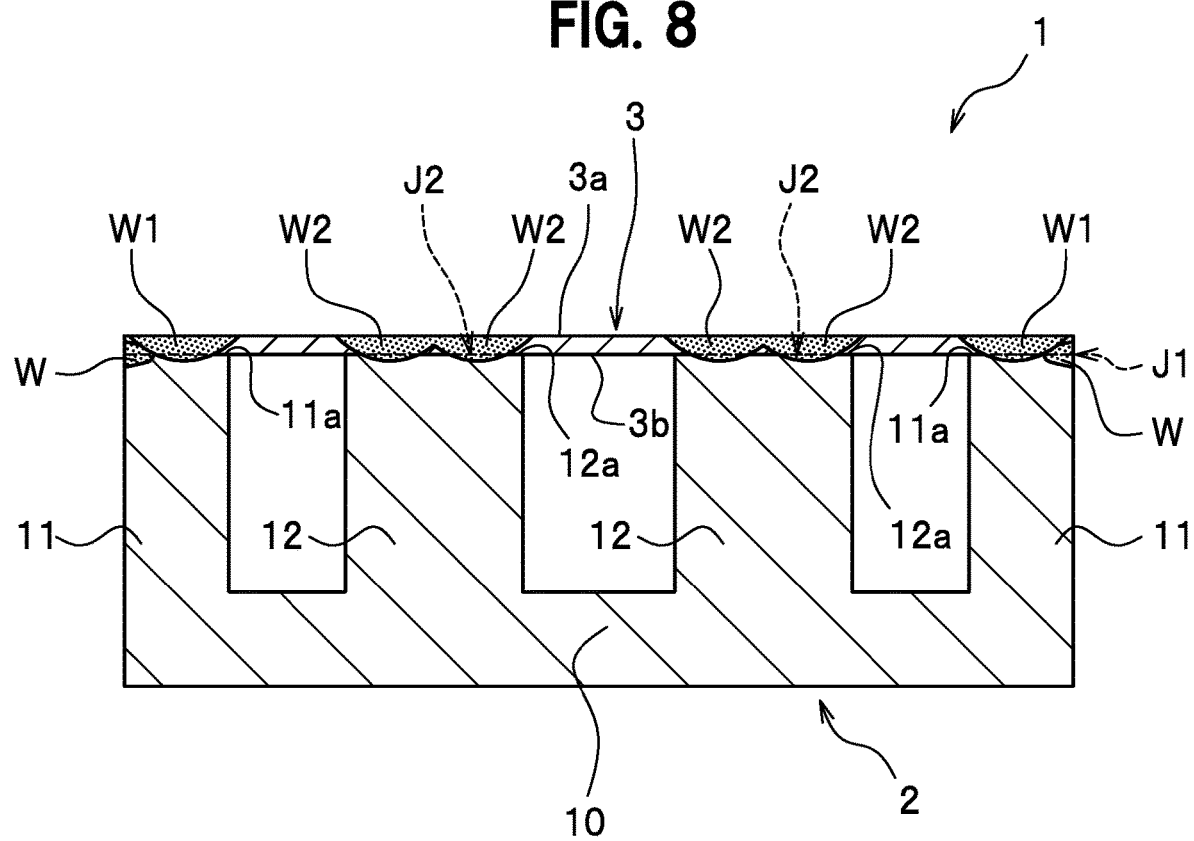
FIG. 8 is a cross-sectional view taken along a line I-I in FIG. 6.

As shown in FIG. 8, the jacket body 2 is joined and integrated with the sealing body 3 by friction stirring as the liquid-cooled jacket 1. The liquid-cooled jacket 1 has a first overlapped portion J1 in which the peripheral wall end surface 11a of the peripheral wall portion 11 is overlapped with the back surface 3b of the sealing body 3, and an second overlapped portion J2 in which a column end surface 12a of the support column 12 is overlapped with the back surface of the sealing body 3, respectively joined by friction stirring. The first overlapped portion J1 is joined by friction stirring from the side of the liquid-cooled jacket 1 over all of the periphery of the liquid-cooled jacket 1. A plasticized area W and W1 is formed in the first overlapped portion J1 and a plasticized area W2 is formed in the second overlapped portion J2. The liquid-cooled jacket has a hollow portion formed therein, in which a heat transferring fluid for transferring heat to the outside flows.

Next, a method for manufacturing a liquid-cooled jacket (a method for manufacturing a liquid-cooled jacket with a heating elements) according to the first embodiment will be described. In the method for manufacturing a liquid-cooled jacket, a preparation step, a placing step, a fixing step, a provisional joining step, a first main joining step, a second main joining step, a drilling step, a burr removing step and a mounting step are performed.

The preparation step is a step of forming the jacket body 2 and the sealing body 3 as shown in FIG. 7. The jacket body 2 is formed by die casting, for example.

Figure 9:
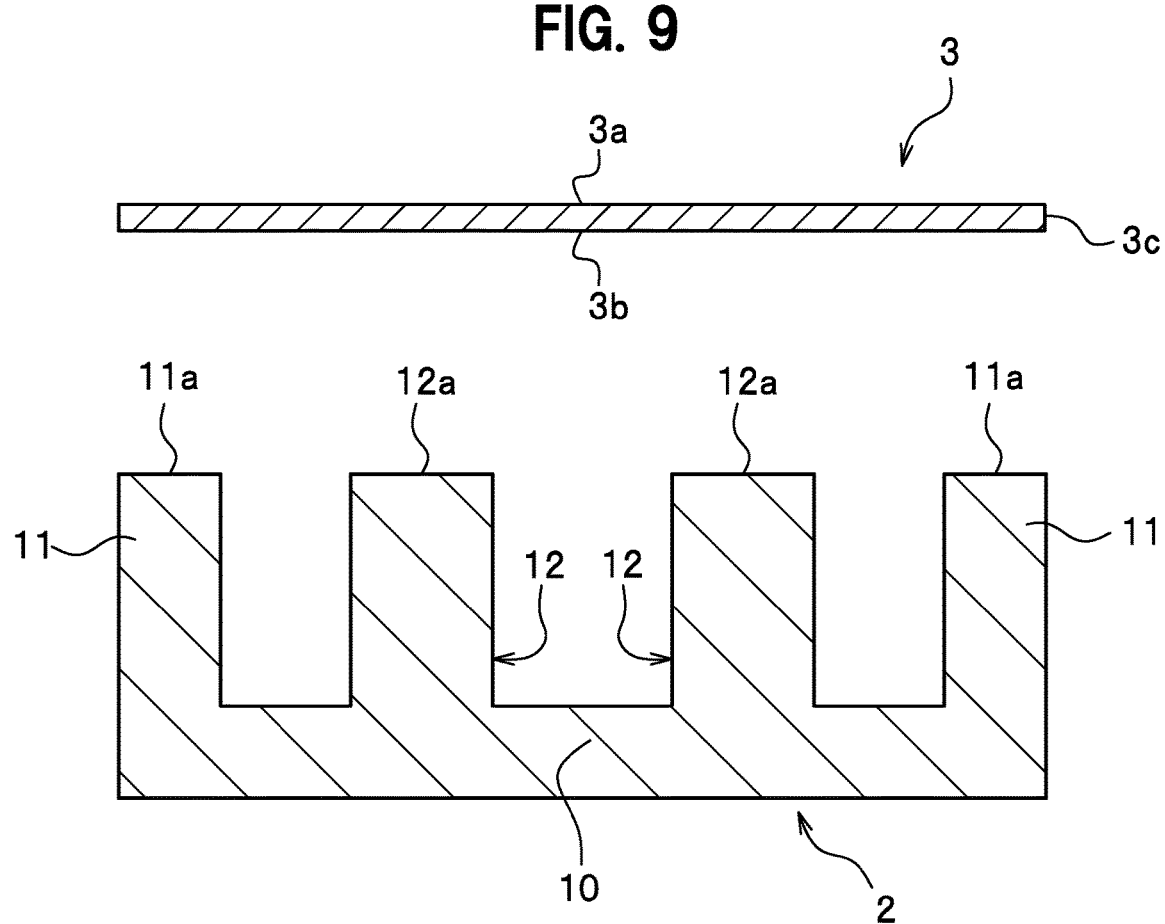
FIG. 9 is a cross-sectional view of the liquid-cooled jacket before the placing step of the method for manufacturing the liquid-cooled jacket according to the first embodiment.
Figure 10:
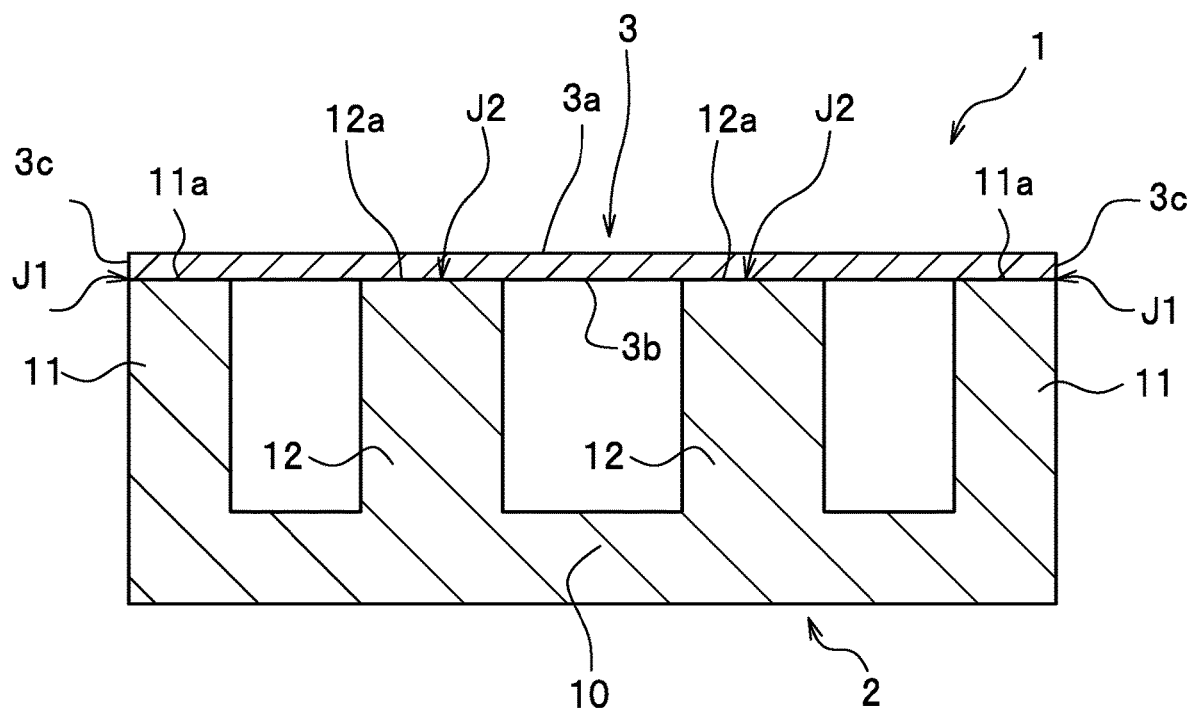
FIG. 10 is a cross-sectional view of the liquid-cooled jacket after the placing step of the method for manufacturing the liquid-cooled jacket according to the first embodiment.

The placing step is a step of placing the sealing body 3 on the jacket body 2 as shown in FIGS. 9 and 10. The back surface 3b of the sealing body 3 comes in surface contact with the peripheral wall end surface 11a of the peripheral wall portion and the support column end surface 12a of the support column, respectively. In the placing step, the peripheral wall end surface 11a of the peripheral wall portion 11 is overlapped with the back surface 3b of the sealing body 3 to form the first overlapped portion J1. The first overlapped portion J1 has a short frame like shape in a planar view. Furthermore, in the placing step, the support column end surface 12a of the support column 12 is overlapped with the back surface 3b of sealing body to form the second overlapped portion J2. The second overlapped portion J2 has a circular shape in a planar view.

In the fixing step, the jacket body 2 and the sealing body 3 are fixed to a table (not shown). The jacket body 2 and the sealing body 3 are immovably restrained to the table by a fixing jig such as a clamp.

Figure 11:
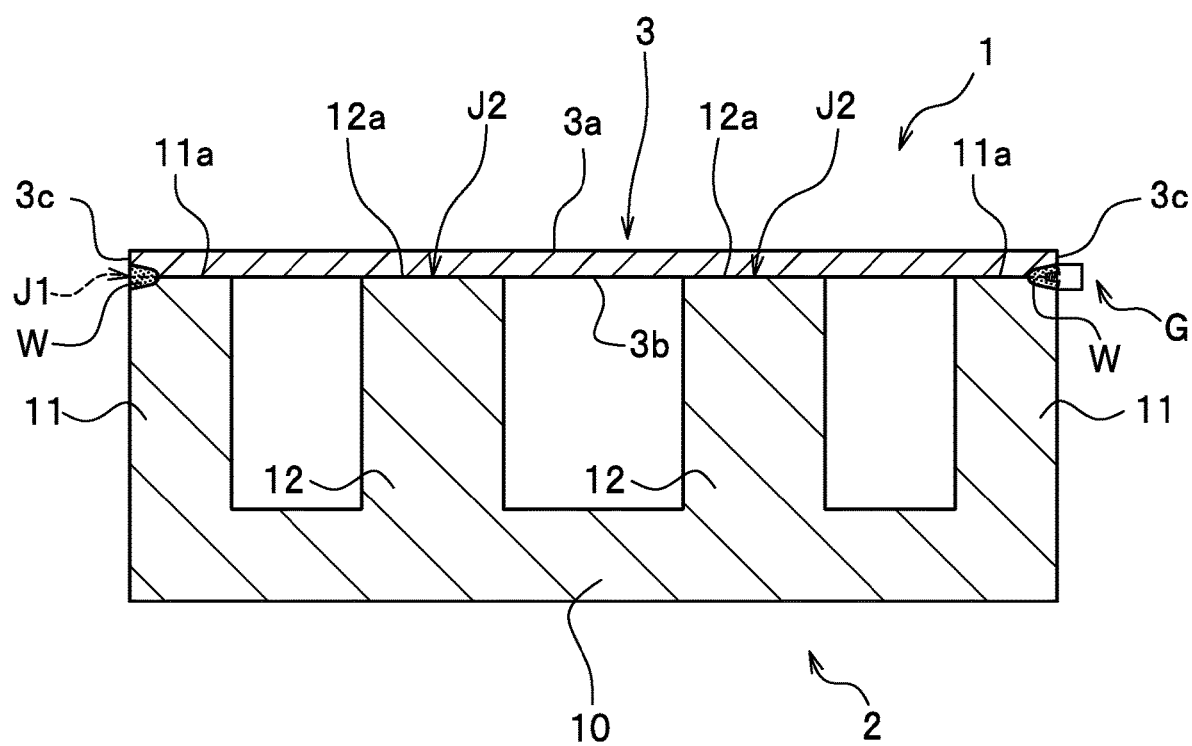
FIG. 11 is a cross sectional view of the liquid-cooled jacket in the provisional joining step of the method for manufacturing the liquid-cooled jacket according to the first embodiment.

The provisional joining step is a step of provisional joining the jacket body 2 with the sealing body 3, as shown in FIG. 11. In the provisional joining step, the provisional joining rotary tool G is inserted into the first overlapped portion J1 from the side of the jacket body 2 and the provisional joining rotary tool G is moved relatively over all the periphery of the jacket body 2. A plasticized area W is formed on the moving trajectory of the provisional joining rotary tool G. The provisional joining may be performed continuously or may be performed intermittently. Since the provisional joining rotary tool G is compact, the thermal deformation of the jacket body 2 and the sealing body 3 in the provisional joining is reduced.

Figure 12:
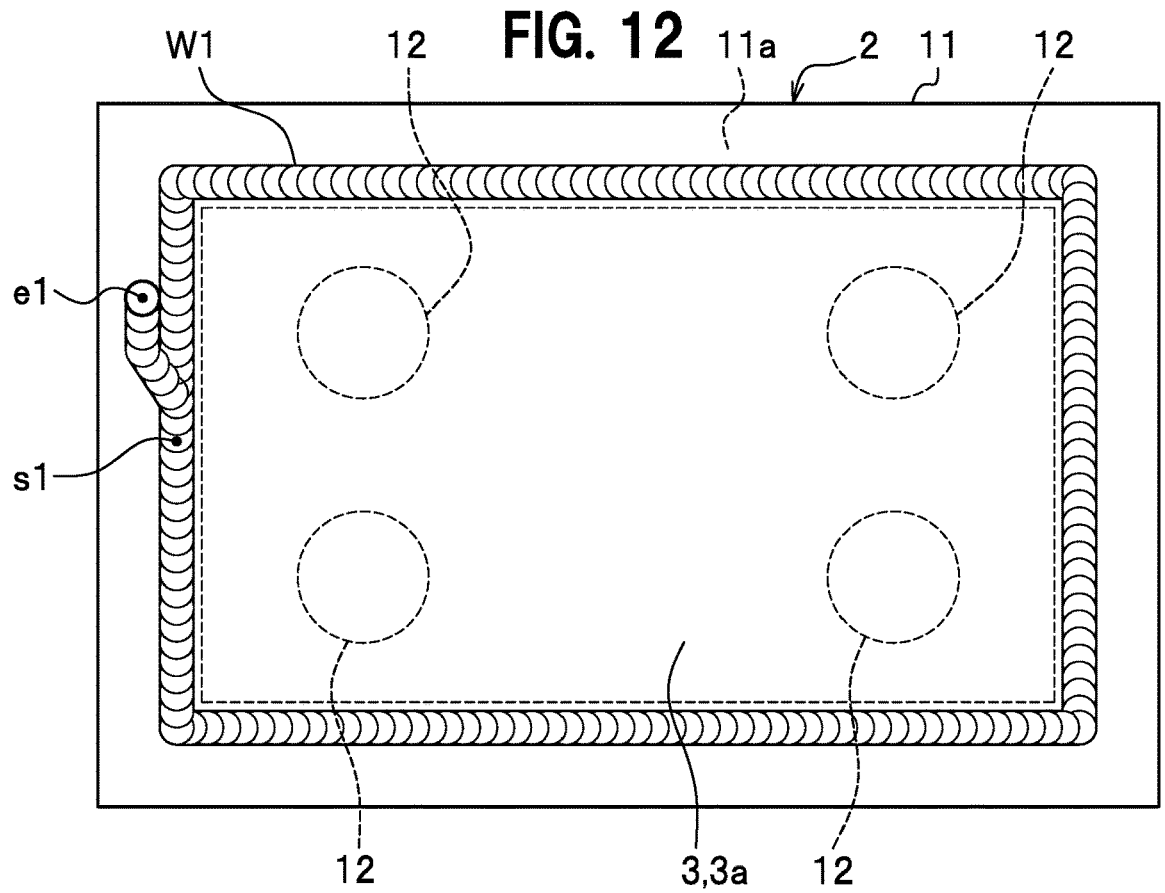
FIG. 12 is a plan view of the liquid-cooled jacket in the first main joining step of the method for manufacturing the liquid-cooled jacket according to the first embodiment.
Figure 13:
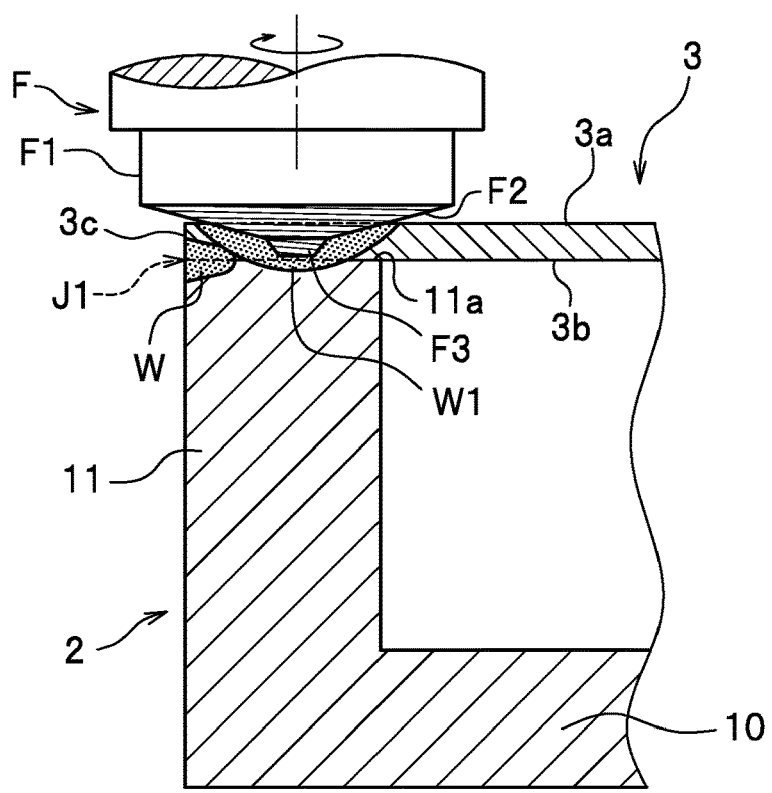
FIG. 13 is a cross-sectional view of the liquid-cooled jacket in the first main joining step of the method for manufacturing the liquid-cooled jacket according to the first embodiment.

As shown in FIGS. 12 and 13, the first main joining step is a step of performing friction stir joining to the first overlapped portion J1 by using the main joining rotary tool F. In the first main joining step, the main joining rotary tool F rotated clockwise is inserted into an arbitrary start position s1 on the surface 3a of the sealing body 3, and the main joining rotary tool F is moved clockwise along the first overlapped portion J1. That is, the main joining rotary tool F is moved around clockwise along the periphery of the sealing body 3. A plasticized area W1 is formed in the first overlapped portion J1 in the first joining step.

In the first main joining step, as shown in FIG. 13, friction stirring is performed under the condition that the tip-end-side pin F3 comes in contact with only the sealing body 3 and the base-end-side pin F2 comes in contact with the sealing body 3. In the first main joining step, friction stir joining is performed while the front surface 3a of the sealing body 3 being pressed by the outer peripheral surface of the base-end-side pin F2 of the main joining tool F. The insertion depth of the main joining rotary tool F is set so that at least the plasticized area W1 reaches the first overlapped portion J1, and at least a part of the base-end-side pin F2 comes in contact with the front surface 3a of the sealing body 3. In the present embodiment, the insertion depth is set so that the tip of the tip-end-side pin F3 does not reach the peripheral wall end surface 11a of the peripheral wall portion 11 and that the central portion in the height direction of the outer circumferential surface of the base-end-side pin F2, or around, is in contact with the front surface 3a of the sealing body 3. Then, the main joining rotary tool F is moved so as to trace the peripheral wall portion 11 with the height position kept constant.

In the case of the main joining rotary tool F being moved clockwise around the sealing body 3 as in the present embodiment, it is preferable to rotate the main joining rotary tool F clockwise. On the other hand, in the case of the main joining rotary tool F being moved counterclockwise around the sealing body 3, it is preferable to rotate the main joining rotary tool F counterclockwise.

When the main joining rotary tool F is rotated clockwise, there is a possibility that a joining defect may occur on the left in the moving direction. When the main joining rotary tool F is rotated counterclockwise, there is a possibility that a joining defect may occur on the right in the moving direction. When such a joining defect is formed at a position close to the hollow portion of the liquid cooled jacket 1, water tightness and air tightness may be reduced. However, by setting the moving direction and the rotating direction of the main joining rotary tool F as described above, the defect is formed at a position away from the hollow portion of the liquid-cooled jacket 1, even if a joining defect associated with friction stir joining is formed, to prevent the decrease of water tightness and air tightness.

As shown in FIG. 12, the main joining rotary tool F is moved around along the first overlapped portion J1, and then is moved to pass the start position s1. Then, the main joining rotary tool F is moved to the end position e1, while being deviated to the outer side. When the main joining rotary tool F reaches the end position e1, the main joining rotary tool F is moved upward to separate the main joining rotary tool F from the sealing body 3.

When a removal trace remains on the sealing body 3 after the main joining rotary tool F is separated from the sealing body 3, a repair step of repairing the removal trace may be performed. In the repair step, overlay welding is performed, for example, to fill the weld metal in the removal trace for repair. This makes the front surface 3a of the sealing body 3 flat.

Note that in the case where the main joining rotary tool F is separated from the sealing body 3, the main joining rotary tool F may be gradually moved upward while moving the main joining rotary tool F on the front surface 3a of the sealing body 3, for example, so that the insertion depth of the main joining rotary tool F is gradually reduced. By doing so, it is possible to prevent the removal trace after the first main joining step from remaining on the front surface 3a of the sealing body 3 or to make the removal trace small.

Figure 14:
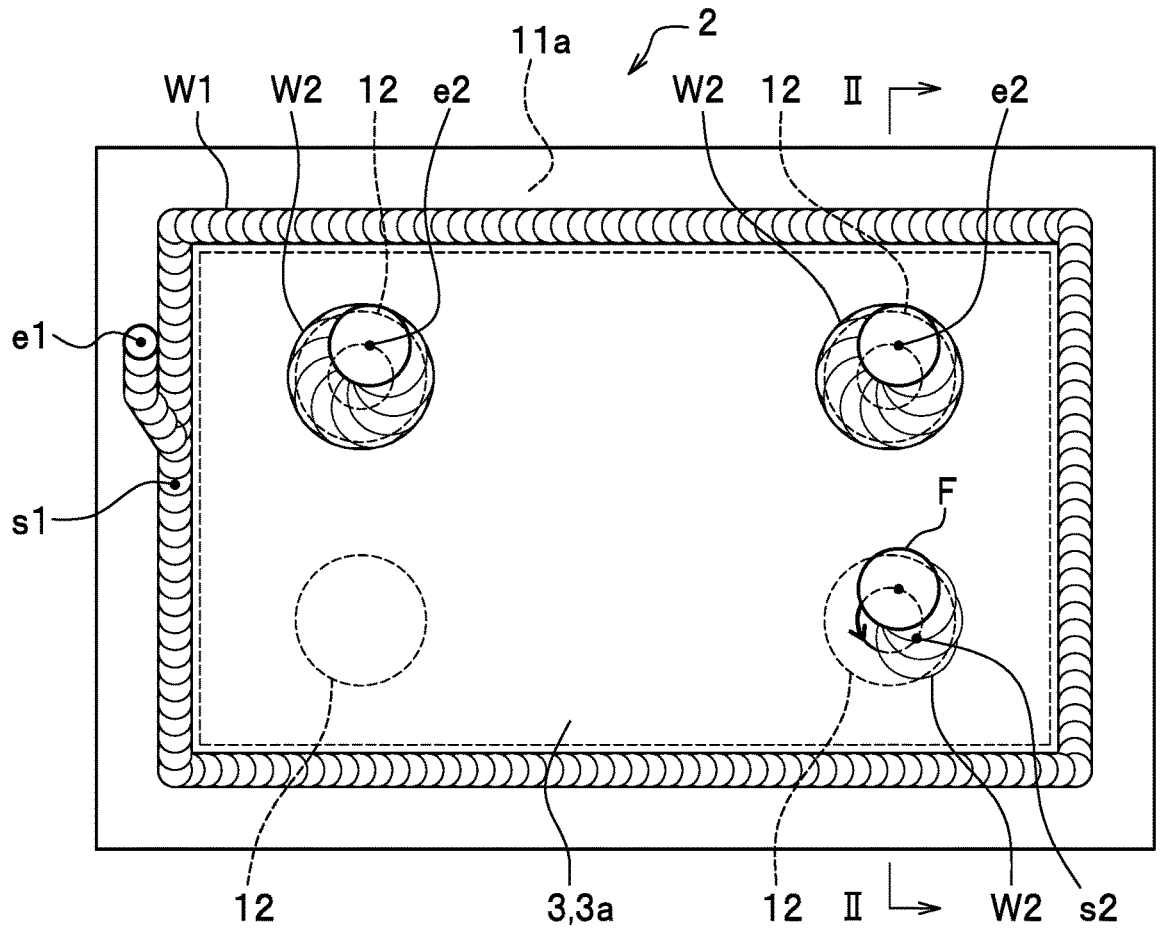
FIG. 14 is a plan view of the liquid-cooled jacket in the second main joining step of the method for manufacturing the liquid-cooled jacket according to the first embodiment.
Figure 15:
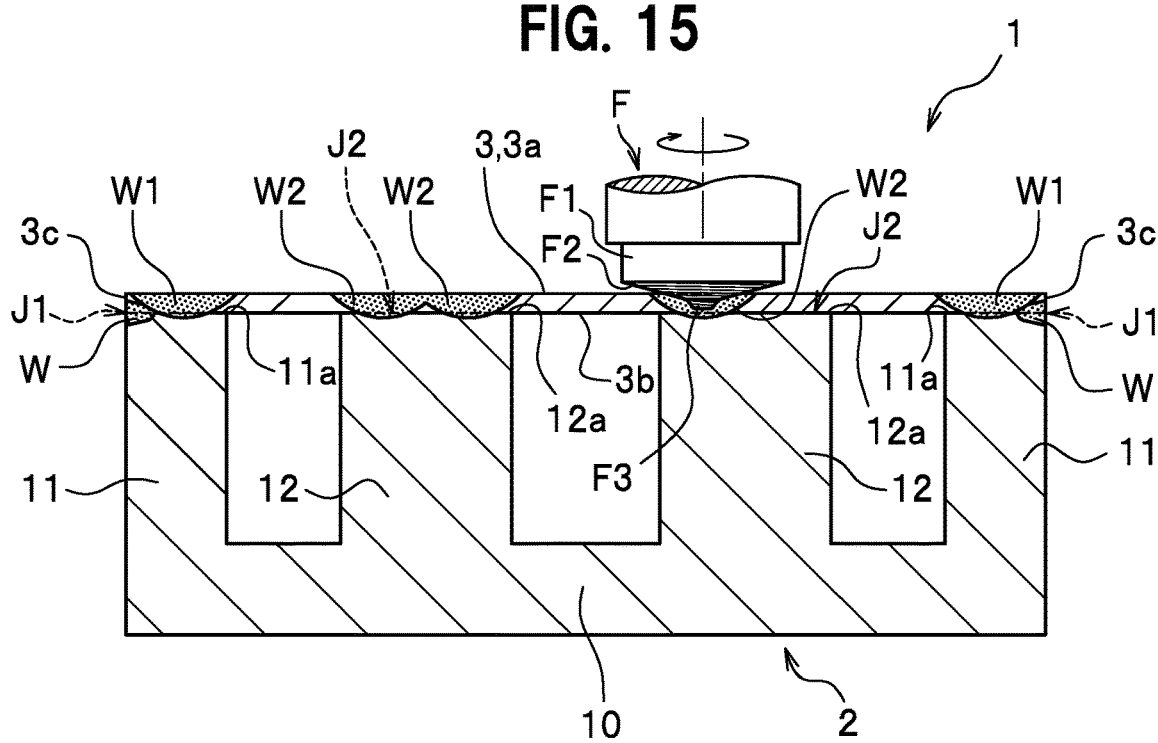
FIG. 15 is a cross-sectional view taken along a line II-II of FIG. 14 showing the second main joining step of the method for manufacturing the liquid-cooled jacket according to the first embodiment.

The second main joining step is a step of performing friction stir joining to the respective second abutted portion J2 by using the main joining rotary tool F, as shown in FIGS. 14 and 15. In the second main joining step, the main joining rotary tool F rotated clockwise is inserted into an arbitrary start position s2 of the second abutted portion J2, and the main joining rotary tool F is moved counterclockwise along the second abutted portion J2. With the second main joining step, a plasticized area W2 is formed in the second abutted portion J2.

In the second main joining step, as shown in FIG. 15, friction stirring is performed with the tip-end-side pin F3 brought in contact with only the sealing body 3 and the base-end-side pin F2 brought in contact with the sealing body 3. In the second main joining step, the friction stir joining is performed while the front surface 3a of the sealing body 3 being pressed by the outer circumferential surface of the base-end-side pin F2 of the main joining rotary tool F. The insertion depth of the main joining rotary tool F is set so that at least the plasticized area W2 reaches the support column end surface 12a, and that at least a part of the base-end-side pin F2 comes in contact with the front surface 3a of the sealing body 3. In the present embodiment, the insertion depth is set so that the tip of the tip-end-side pin F3 does not reach the support column end surface 12a and that the center portion in the height direction of the outer peripheral surface of the base-end-side pin F2, or around, comes in contact with the front surface 3a of the sealing body 3. Then, the main joining rotary tool F is moved so as to trace the periphery of the support column 12 with the height position kept constant.

Note that the insertion depth of the main joining rotary tool F may not necessarily be constant. For example, the insertion depth may be changed between the first main joining step and the second main joining step. In addition, the insertion depth of the main joining rotary tool F may be set so that the tip of the tip-end-side pin F3 comes in contact with the peripheral wall end surface 11a of the peripheral wall portion 11 and the support column end surface 12a of the support column 12, that is, the tip-end-side pin F3 comes in contact with both of the jacket body 2 and the sealing body 3. At this time, the plastically fluidized material needs to be prevented from flowing out to the inside of the liquid-cooled jacket 1.

In the second main joining step, in the case of the main joining rotary tool F being moved counterclockwise with respect to the support column 12 as in the present embodiment, it is preferable to rotate the main joining rotary tool F clockwise. On the other hand, in the case of the main joining rotary tool F being moved clockwise with respect to the support column 12, it is preferable to rotate the main joining rotary tool F counterclockwise. By setting the moving direction and the rotating direction of the main joining rotary tool F as described above, a joining defect due to friction stir joining, even if formed, is formed at a position away from the hollow portion of the liquid-cooled jacket 1, to allow for preventing the decrease in water tightness and air tightness.

As shown in FIG. 14, the main joining rotary tool F is moved around along the periphery of the support column 12, and further moved to pass through the starting position s2. Then, the main joining rotary tool F is moved to the end position e2 set on the front surface 3a of the sealing body 3 (the second overlapped portion J2). Once the main joining rotary tool F is reached at the end position e2, the main joining rotary tool F is moved upward to separate the main joining rotary tool F from the sealing body 3.

When a removal trace remains in the front surface 3a of the sealing body 3 after the main joining rotary tool F is separated from the sealing body 3, a repair step of repairing the removal trace may be performed. In the repair step, overlay welding may be performed to fill the weld metal in the removal trace to repair it, for example. This makes the front surface 3a of the sealing body 3 flat.

Note that when the main joining rotary tool F is separated from the sealing body 3, the main joining rotary tool F may be moved toward the center of the support column 12 and separated from the support column 12. Furthermore, in the case of separating the main joining rotary tool F from the sealing body 3, the main joining rotary tool F may be gradually moved upward while moving the main joining rotary tool F on the sealing body 3, for example, so that the insertion depth of the main joining rotary tool F is gradually reduced. By doing so, the removal trace after the second main joining step is prevented from remaining on the front surface 3a of the sealing body 3 or is reduced in size.

Figure 16:
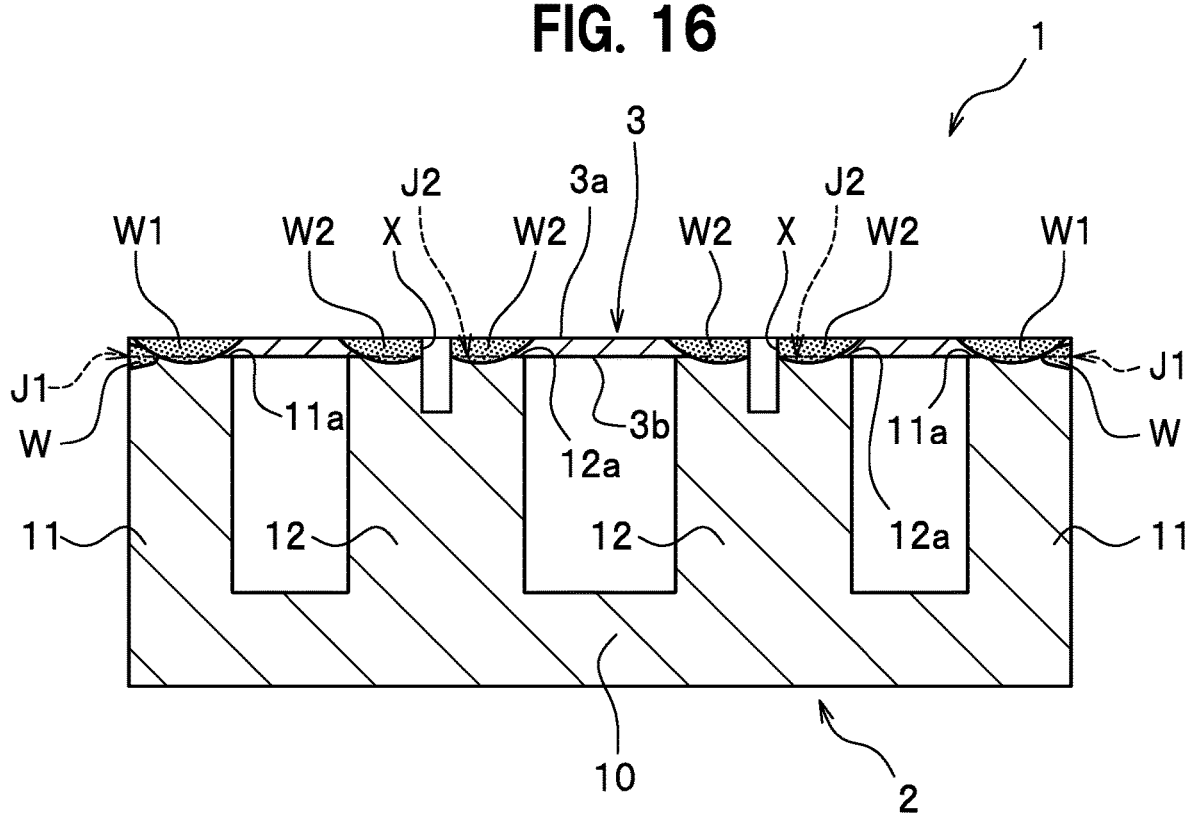
FIG. 16 is a cross-sectional view of the liquid-cooled jacket in the drilling process of the method for manufacturing the liquid-cooled jacket according to the first embodiment.

The drilling step is a step of forming fixing holes X communicating with the sealing body 3 and respective support columns as shown in FIG. 16. The fixing hole X is formed so as to penetrate a part of the plasticized area W1 to reach the support column 12.

In the burr removing step, the burrs exposed on the surfaces of the jacket body 2 and the sealing body 3 with the provisional joining step, the first main joining step, the second main joining step, and the drilling step, are removed. This allows for finishing the surfaces of the jacket body 2 and the sealing body 3 clean.

Figure 17:
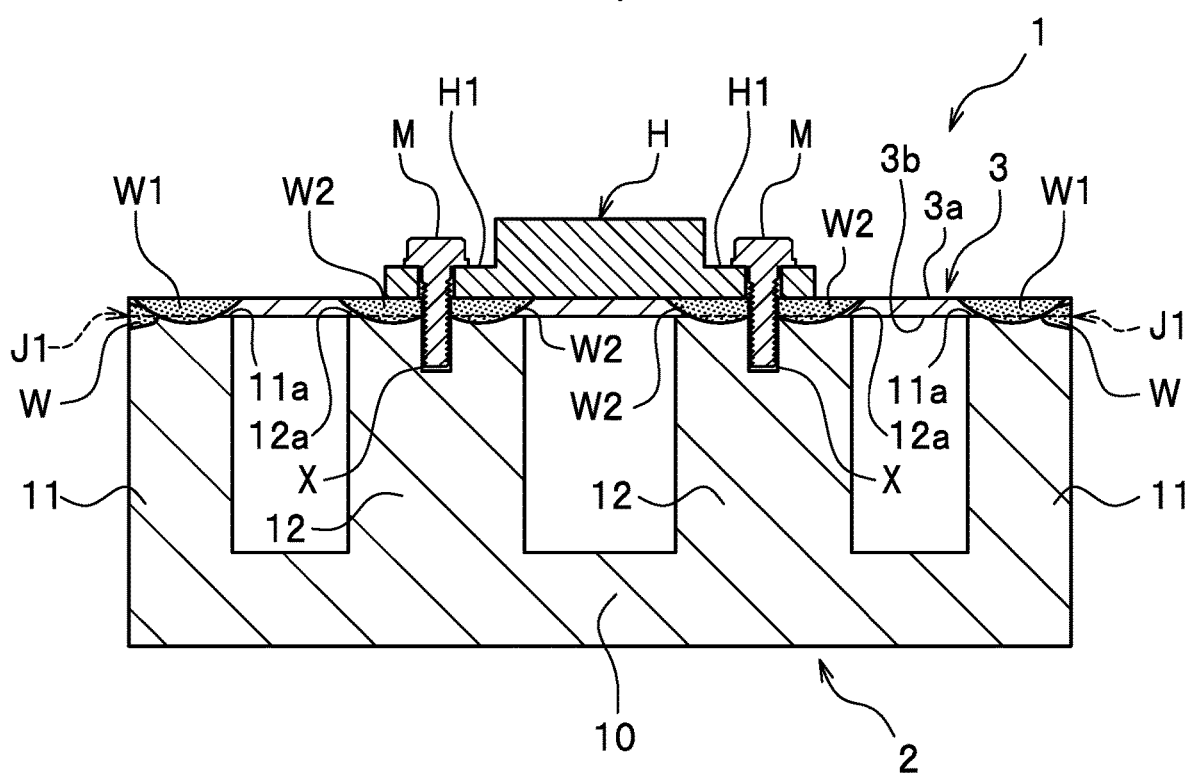
FIG. 17 is a cross-sectional view of the liquid-cooled jacket in the mounting step of the method for manufacturing the liquid-cooled jacket according to the first embodiment.

The mounting step is a step of mounting the heating element H by means of the mounting member M as shown in FIG. 17. When the heating element H is mounted, the through hole formed in the flange H1 of the heating element H is communicated with the fixing hole X and the heating element H is fixed by the mounting member M such as a screw. The mounting member M is inserted to reach the support column 12.

Note that the fixing hole X is formed on the sealing body 3 side to mount the heating element H to the sealing body 3 side in the present embodiment, but the fixing hole X reaching the support column 12 may be formed in the bottom portion 10 to mount the heating element H the bottom portion 10. The heating element H may be mounted to at least one of the sealing body 3 and the bottom portion 10. Moreover, although the fixing hole X is formed in the present embodiment, the heating element H may be fixed with the mounting member M without forming the fixing hole X.

Next, the advantageous effects of the present embodiment will be described.

Figure 18:
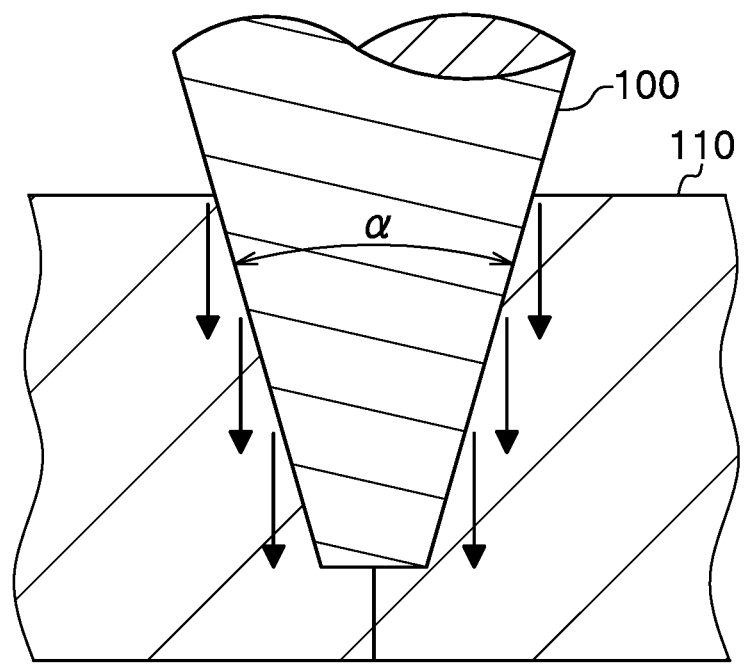
FIG. 18 is a conceptual view of a conventional shoulder-less rotary tool.
Figure 19:
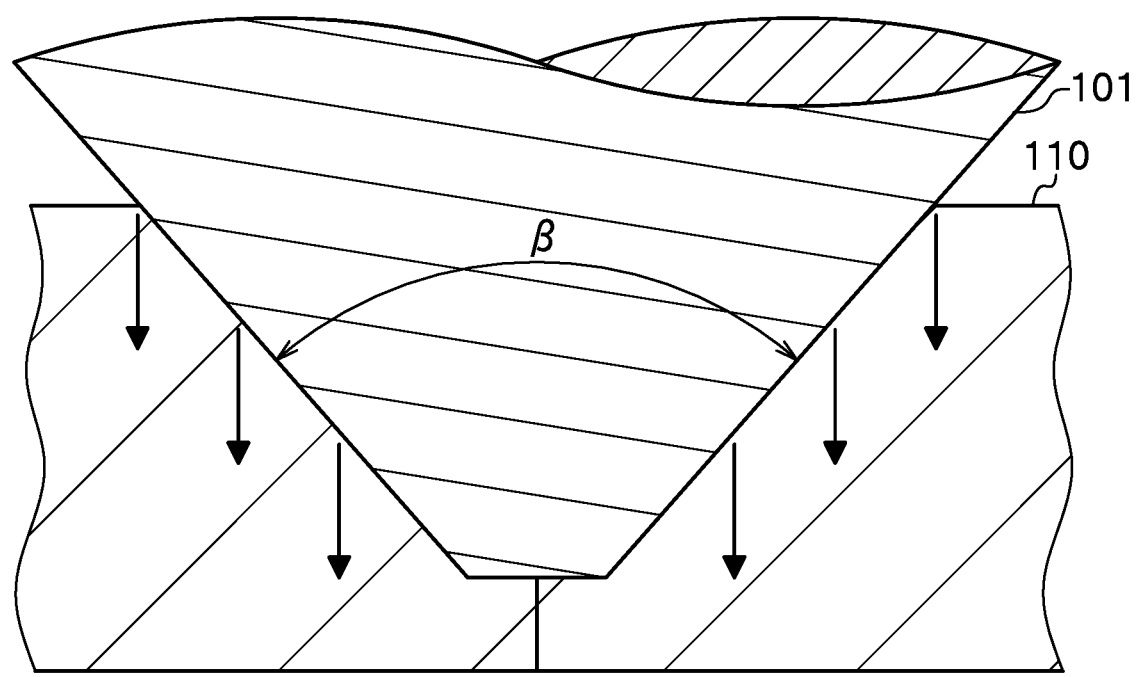
FIG. 19 is a conceptual view of a conventional rotary tool.

As shown in FIG. 18, since the conventional shoulder-less main joining rotary tool 100 does not press the surface of the metal members 110 to be joined by the shoulder portion, there is a problem that the concave groove (the concave groove made with the surface of the joined metal members and the surface of the plasticized area) increases in size and the joined surface increases in roughness. In addition, there is a problem that a bulging portion (a portion where the surfaces of the joined metal members expand as compared with those before joining) is generated to the recessed groove. Alternatively, when the taper angle β of the main joining rotary tool 101 is larger than the taper angle α of the shoulder-less main joining rotary tool 100 as in the case of the main joining rotary tool 101 in FIG. 19, the surface of the joined metal members 110 may be pressed compared to the shoulder-less main joining rotary tool 100, so the recessed groove is reduced in size and the bulging portion is reduced in size. However, since the downward plastic flow increases, a kissing bond is likely to be formed under the plasticized area.

In contrast, according to the method for manufacturing a liquid-cooled jacket of the present embodiment, the main joining rotary tool F comprises a base-end-side pin F2 and a tip-end-side pin F3 whose taper angle is smaller than the taper angle A1 of the base-end-side pin F2. This facilitates inserting, the main joining rotary tool F can be easily inserted into the jacket body 2 and the sealing body 3. In addition, since the taper angle A2 of the tip-end-side pin F3 is small, the main joining rotary tool F can be easily inserted to a deep position of the jacket body 2 and the sealing body 3. In addition, since the taper angle A2 of the tip-end-side pin F3 is small, the downward plastic flow can be prevented as compared with the main joining rotary tool 101. For this reason, forming a kissing bond in the lower part of the plasticized areas W1, W2 is prevented. On the other hand, since the taper angle A1 of the base-end-side pin F2 is large, stable joining can be performed as compared with the conventional rotary tool even if the thickness of the jacket body 2 and the sealing body 3 and the height position of joining are changed.

In addition, since the plastically fluidized material is pressed by the outer peripheral surface of the base-end-side pin F2, the recessed groove generated on the joined surface is reduced in size and the bulging portion generated next to the recessed groove is eliminated or become smaller. Furthermore, since the stairs-like pin step portion 30 is shallow and has an exit angle, the plastically fluidized material is easily pushed out to the outside of the pin step portion 30 while the plastically fluidized material is pressed by the step bottom surface 30a. Then, even though the plastically fluidized material is pressed by the base-end-side pin F2, the plastically fluidized material less likely adheres to the outer circumferential surface of the base-end-side pin F2. Therefore, the joined surface is reduced in roughness, and joining quality is stabilized suitably.

Moreover, since the sealing body 3 is supported by the support column 12 and the sealing body 3 is joined with the support column 12 by the friction stirring, the deformation resistance of the liquid-cooled jacket 1 is enhanced. Furthermore, according to the present embodiment, since the support column 12 is disposed in the hollow portion in the liquid-cooled jacket 1, the heat transferring fluid also comes in contact with the outer circumferential surface of the support column 12. Therefore, the heat transferred from the heating element H to the support column 12 via the mounting member M is efficiently discharged. That is, the heat leaking through the mounting member M, which fixes the heating element H to the liquid-cooled jacket 1, is prevented. Furthermore, since the support columns 12, to which the heating element H is fixed, are disposed inside the jacket body 2, the liquid-cooled jacket 1 may be reduced in size.

Furthermore, according to the method for manufacturing a liquid-cooled jacket according to the present embodiment, since the tip-end-side pin F3 is inserted into the jacket body 2A and the sealing body 3A or inserted into only the sealing body 3A and the base-end-side pin F2 is inserted into the sealing body 3A, the load applied to the friction stir device is reduced as compared with such a case that the shoulder portion of the rotary tool is pushed into, and the operability of the main joining rotary tool F is also improved. Moreover, since the load applied to the friction stir device is reduced, the deep positions of the first overlapped portion J1 and the second overlapped portion J2 are joined with no large load applied to the friction stir device.

Furthermore, according to the method for manufacturing a liquid-cooled jacket of the present embodiment, the provisional joining step before the first main joining step is performed, and the sealing body 3 is prevented from displacing from a proper position when performing the first main joining step and the second main joining step.

Hereinabove, although the method for manufacturing the liquid-cooled jacket of the first embodiment of the present invention has been described, appropriate design change is possible within the scope of the present invention. For example, the main joining step is performed in the order of the first overlapped portion J1 and the second overlapped portion J2 in the present embodiment, but the second overlapped portion J2 may be joined first by friction stirring. In addition, the cooling medium may be flown into the jacket body 2 to perform the friction stir joining, while the jacket body 2 and the sealing body 3 being cooled, in the first main joining step and the second main joining step. This keeps the frictional heat at a low level, to reduce the deformation of the liquid-cooled jacket 1 caused by the thermal contraction. Moreover, according to such a method, cooling may be performed using the jacket body 2 and the sealing body 3 themselves without separately using a cooling plate, a cooling means, etc. In addition, the flat cross-sectional shape of the support column 12 may be other shape.

In addition, although provisional joining is performed using the provisional joining rotary tool G in the first embodiment, provisional joining may be performed using the main joining rotary tool F. This eliminates time and effort of replacing the rotary tool. Furthermore, the provisional joining step may be performed to the overlapped portion 2 by inserting the provisional joining rotary tool G or the main joining rotary tool F from above of the sealing body 3. Additionally, the provisional joining step may be performed to at least one of the first overlapped and the second overlapped portion J2. Furthermore, the provisional joining step may be performed to the first overlapped portion J1 from the side of the jacket body 2 by welding.

Furthermore, the main joining tottery tool f and the provisional joining rotary tool G may be attached to a robot arm having a spindle unit or the like at its tip, for example. According to this configuration, the rotation axes of the main joining rotary tool F and the provisional joining rotary tool G are easily changed to have various inclination angles. In the provisional joining step of the present embodiment, although the provisional joining rotary tool G is inserted from the side of the jacked body 2, friction stirring may be easily performed from the side of the jacket body 2 by attaching the provisional joining rotary tool G to the tip of the robot arm, for example.

In addition, in the main joining step of the present embodiment, although the main joining rotary tool F is inserted from above of the front surface 3a of the sealing body 3, friction stirring may be performed over all of the periphery of the jacket body 2 while the main joining rotary tool F is inserted into the first overlapped portion J1 from the side of the jacket body 2. In this case, friction stirring may be easily performed by attaching the main joining rotary tool F to the tip of the robot arm.

First Modification

Figure 20:
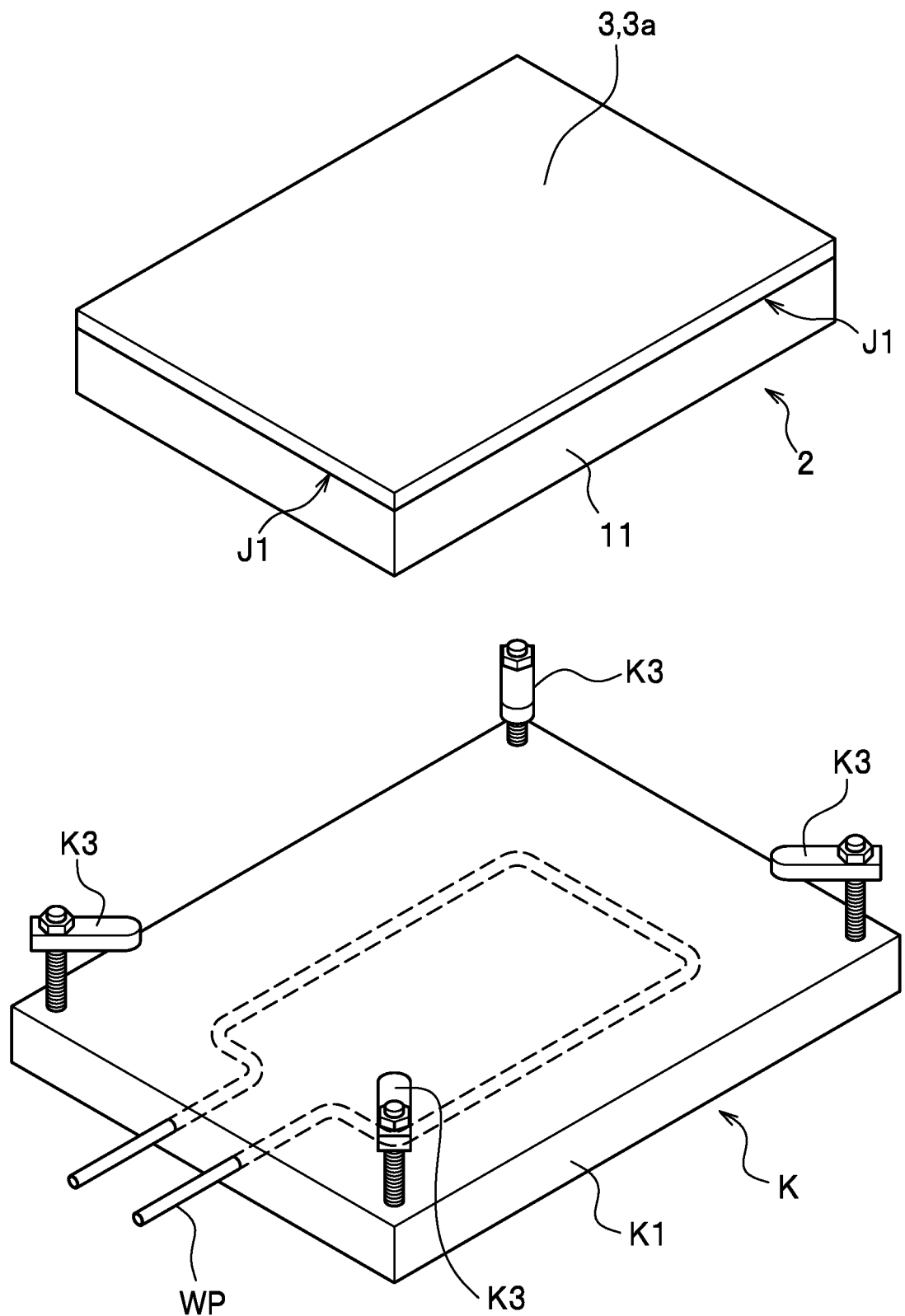
FIG. 20 is a perspective view of the liquid-cooled jacket in a first modification of the method for manufacturing the liquid-cooled jacket according to the first embodiment.

Next, a method for manufacturing the liquid-cooled jacket according to a first modification of the first embodiment will be described. As shown in FIG. 20, the first modification is different from the first embodiment in that the provisional joining step, the first main joining step, and the second main joining step are performed using a cooling plate. The first modification will be described focusing on differences from the first embodiment.

As shown in FIG. 20, the jacket body 2 is fixed to the table K in the fixing step in the first modification. The table K is configured with a basal plate K1 having a rectangular parallelepiped shape, clamps K3 formed at four corners of the basal plate K1, and a cooling pipe WP arranged inside the basal plate K1. The table K is a member which restrains the jacket body 2 so as to be immovable and functions as a "cooling plate" in the claims.

The cooling pipe WP is a tubular member embedded inside the basal plate K1. Inside the cooling pipe WP, a cooling medium for cooling the basal plate K1 flows. The arrangement position of the cooling pipe WP, that is, the shape of the cooling flow passage through which the cooling medium flows is not particularly limited, but in the first modification, is in a planar shape along the moving trajectory of the main joining rotary tool Fin the first main joining step. That is, the cooling pipe WP is arranged so that the cooling pipe WP substantially overlaps the first overlapped portion J1.

In the provisional joining step, the first main joining step and the second main joining step of the first modification, after the jacket body 2 is fixed to the table K, friction stir joining is performed with a cooling medium flowed through the cooling pipe WP. This keeps the frictional heat during the friction stirring at a low level to reduce the deformation of the liquid-cooled jacket 1 resulting from heat contraction. Furthermore, since the cooling flow passage overlaps in a planar view with the first overlapped portion J1 (the moving trajectory of the provisional joining rotary tool G and the main joining rotary tool F) in the first modification, it is possible to intensively cool the portion where frictional heat is generated. This enhances the cooling efficiency. Furthermore, since the cooling pipe WP is disposed to circulate the cooling medium, the management of the cooling medium is easy. Moreover, since the table K (cooling plate) and the jacket body 2 are in surface contact with each other, the cooling efficiency is enhanced.

Note that friction stir joining may be performed with the jacket body 2 and the sealing body 3 being cooled by using a table K (cooling plate), and also with a cooling medium being flowed inside of the jacket body 2.

Second Modification

Figure 21:
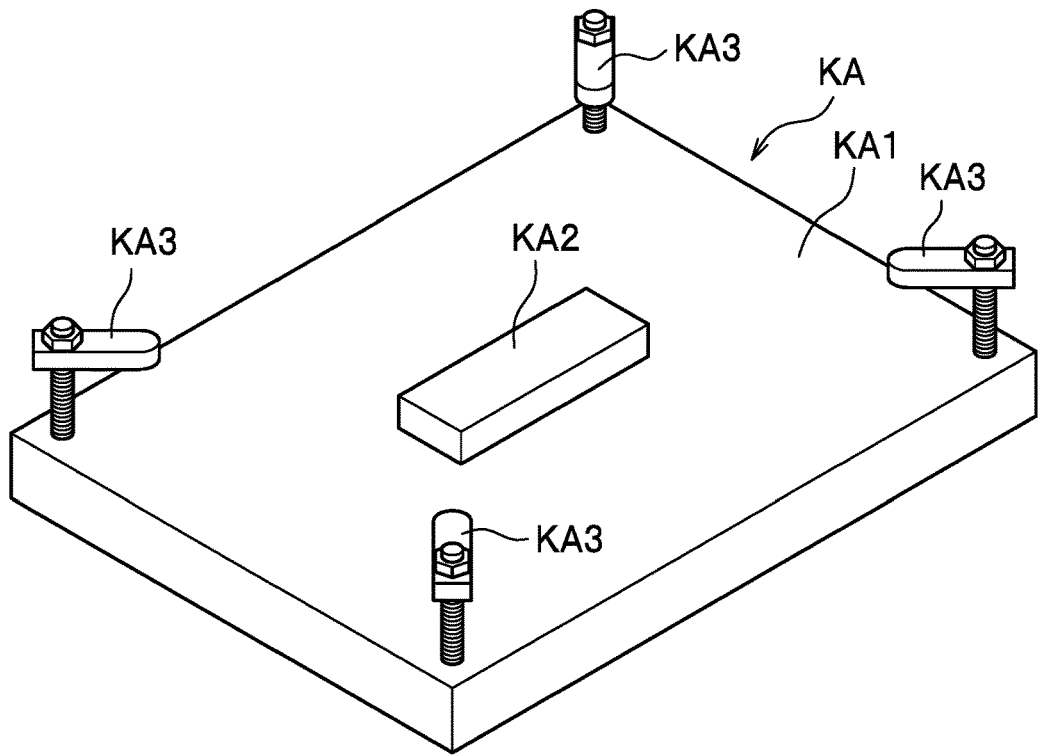
FIG. 21 is a perspective view of a table in the second modification of the method for manufacturing the liquid-cooled jacket according to the first embodiment.
Figure 22:
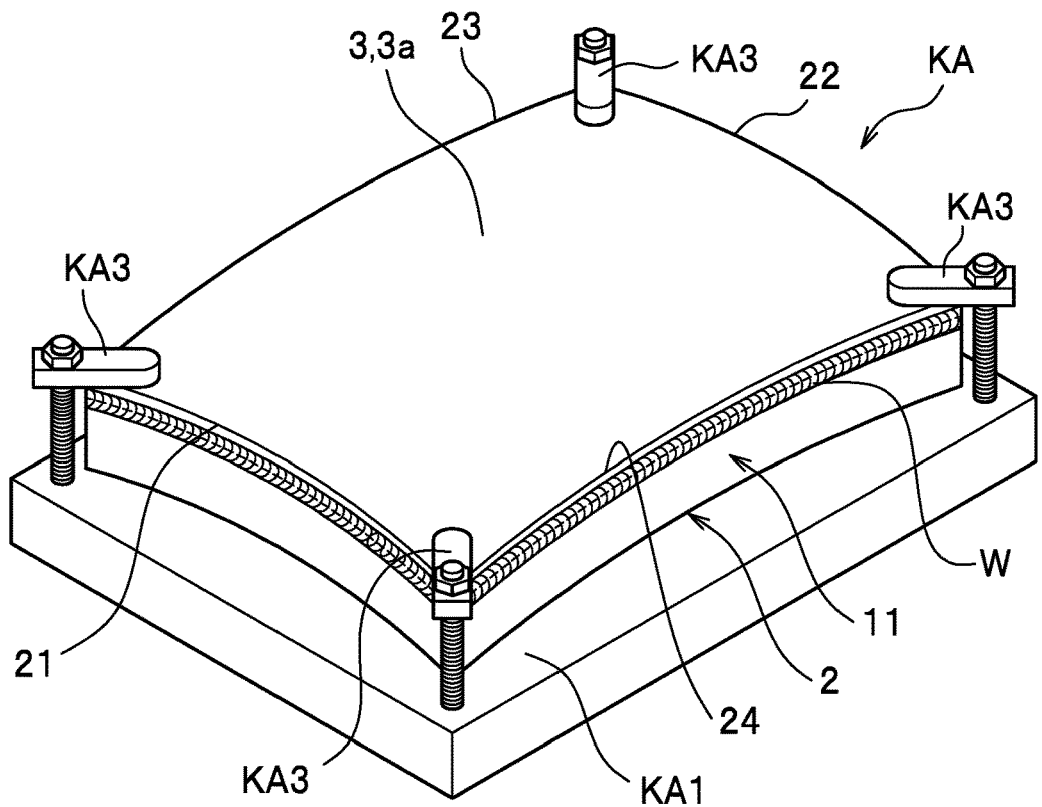
FIG. 22 is a perspective view of the liquid-cooled jacket and sealing body fixed to a table in the second modification of the method for manufacturing the liquid-cooled jacket according to the first embodiment.

Next, a method for manufacturing a liquid-cooled jacket according to a second modification of the first embodiment will be described. As shown in FIGS. 21 and 22, the second modification is different from the first embodiment in that the first main joining step and the second main joining step are performed with the front surface of the jacket body 2 and the front surface 3a of the sealing body 3 curved so as to be convex upward. The second modification will be described focusing on differences from the first embodiment.

As shown in FIG. 21, a table KA is used in the second modification. The table KA is configured with a basal plate KA1 in the form of a rectangular parallelepiped, a spacer KA2 formed at the center of the basal plate KA1, and clamps KA3 formed at the four corners of the basal plate KA1. The spacer KA2 may be integral with or separate from the basal plate KA1.

In the fixing step of the second modification, the jacket body 2 and the sealing body 3 integrated in the provisional joining step are fixed to the table KA by the clamps KA3. As shown in FIG. 22, when the jacket body 2 and the sealing body 3 are fixed to the table KA, the bottom 10 of the jacket body 2, the peripheral wall end surface 11a and the front surface 3a of the sealing body 3 are curved so as to be convex upward. More specifically, those described are curved so that the first side 21, the second side 22, the third side 23 and the fourth side 24 of the sealing body 3 of the jacket body 2 exhibit curved lines.

In the first main joining step and the second main joining step of the second modification, friction stir joining is performed using the main joining rotary tool F. In the first main joining step and the second main joining step, an amount of deformation of at least one of the jacket body 2 and the sealing body 3 is measured, and the friction stir joining is performed while the insertion depth of the tip-end-side pin F3 of the main joining rotary tool F being adjusted according to the amount of deformation. That is, the main joining rotary tool F is moved so that the moving trajectory thereof exhibits a curved line along the curved surface of the circumferential wall end surface 11a of the jacket body 2 and the front surface 3a of the sealing body 3. This makes the depths and widths of the plasticized areas W1 and W2 constant.

Thermal contraction may occur in the plasticized areas W1 and W2 due to the heat input from the friction stir joining to deform portions, closer to the sealing body 3, of the liquid-cooled jacket 1 in a concave shape. However, according to the first main joining step and the second main joining step of the second modification, since the jacket body 2 and the sealing body 3 are fixed in a convex upward shape in advance so that tensile stress acts on the peripheral wall end surface 11a and the front surface 3a, the liquid-cooled jacket 1 is made flat by way of thermal contraction after friction stir joining. In addition, when the main joining step is performed with the conventional rotary tool, there is a problem that if the jacket body 2 and the sealing body 3 are warped in a convex shape, the shoulder portion of the rotary tool has in contact with the jacket body 2 and the sealing body 3 and the operability is bad. However, according to the second modification, since the shoulder portion does not exist in the main joining rotary tool F, even when the jacket body 2 and the sealing body 3 are warped in a convex shape, the operability of the main joining rotary tool F is good.

An amount of deformation of each of the jacket body 2 and the sealing body 3 may be measured by using a well-known height detection device. In addition, the first main joining step and the second main joining step may be performed while an amount of deformation of the jacket body 2 and the sealing body 3 being detected, for example, using a friction stir device equipped with a detection device for detecting the height from the table KA to at least one of the jacket body 2 and the sealing body 3.

Furthermore, the jacket body 2 and the sealing body 3 are curved in the second modification so that all of the sides from the first side 21 to the fourth side 24 exhibit curved lines, but the present invention is not limited thereto. For example, the first side 21 and the second side 22 may exhibit straight, while the third side 23 and the fourth side 24 may exhibit curved lines. Also, for example, the first side 21 and the second side 22 may exhibit curved lines, and the third side 23 and the fourth side 24 may exhibit straight lines.

Furthermore, the height position of the tip-end-side pin F3 of the main joining rotary tool F is changed according to the amount of deformation of the jacket body 2 or the sealing body 3 in the second modification. However, the main joining step may be performed with the height of the tip-end-side pin F3 of the main joining rotary tool F with respect to the table KA kept constant.

In addition, the spacer KA2 may have any shape as long as the front surfaces of the jacket body 2 and the sealing body 3 are fixed so as to be convex. Furthermore, the spacer KA2 may be omitted as long as the front surfaces of the jacket body 2 and the sealing body 3 are fixed so as to be convex.

Third Modification

Figure 23:
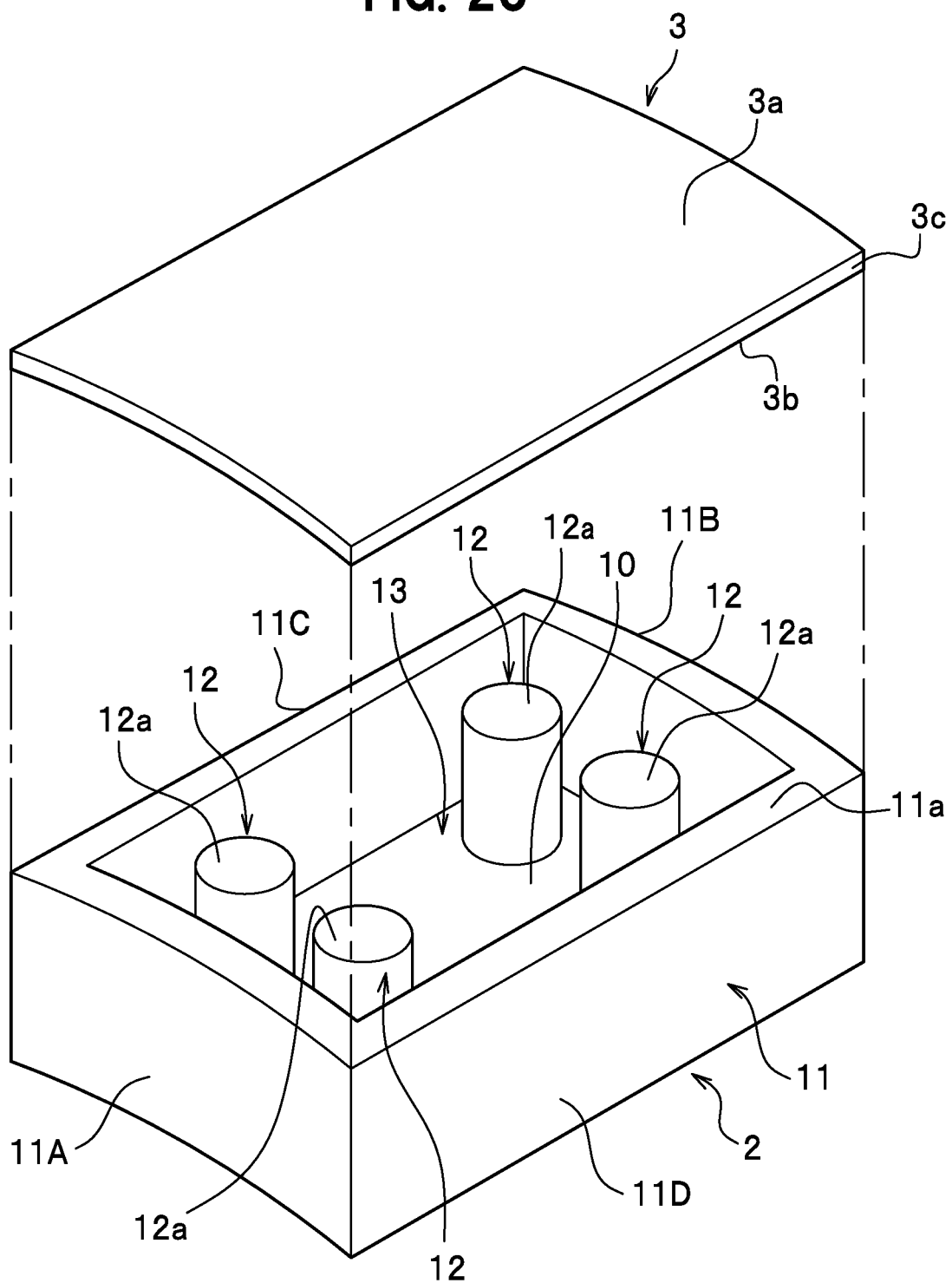
FIG. 23 is a disassembled perspective view of the liquid-cooled jacket in the third modification of the method for manufacturing the liquid-cooled jacket according to the first embodiment.

Next, a method for manufacturing the liquid-cooled jacket according to the third modification of the first embodiment will be described. As shown in FIG. 23, the third modification is different from the first embodiment in that the jacket body 2 and the sealing body 3 are formed in advance so as to be convexly curved toward the front surfaces thereof in the preparation step. The third modification will be described focusing on differences from the first embodiment.

In the preparation step according to the third modification, the jacket body 2 and the sealing body 3 are formed by die casting so as to be convexly curved toward the front surfaces thereof. This makes the jacket body 2 formed so that the bottom portion 10 and the peripheral wall portion 11 are convex toward the front surfaces thereof, respectively. Moreover, the front surface 3a of the sealing body 3 is formed so as to be convex.

As shown in FIG. 24, when the fixing step is performed in the third modification, the jacket body 2 and the sealing body 3 provisional joined are fixed to the table KB. The table KB is configured with a basal plate KB1 having a rectangular parallelepiped shape, a spacer KB2 arranged at the center of the basal plate KB1, clamps KB3 formed at four corners of the basal plate KB1, and a cooling pipe WP embedded inside the basal plate KB1. The table KB is a member that restrains the jacket body 2 so as to be immovable and functions as a "cooling plate" in the claims.

The spacer KB2 is composed of a curved surface KB2a which is curved to be convex upward, and elevated surfaces KB2b and KB2b which are formed at both ends of the curved surface KB2a and rise from the basal plate KB1. The first side Ka and the second side Kb of the spacer KB2 exhibit curved lines, and the third side Kc and the fourth side Kd exhibit straight lines.

The cooling pipe WP is a tubular member embedded inside the basal plate KB1. A cooling medium for cooling the basal plate KB1 flows in the cooling pipe WP. The position of disposing the cooling pipe WP, that is, the shape of the cooling flow passage in which the cooling medium flows is not particularly limited. In the third modification, the passage has a planar shape along the moving trajectory of the main joining rotary tool F in the first main joining step. That is, the cooling pipe WP substantially overlaps with the first overlapped portion J1 substantially overlap.

In the fixing step of the third modification, the jacket body 2 integrated with the sealing body 3 by the provisional joining are fixed to the table KB by the clamps KB3. More specifically, those described are fixed to the table KB so that the back surface of the bottom portion 10 of the jacket body 2 comes in surface contact with the curved surface KB2a. The jacket body 2, when fixed to the table KB, is curved so that the first side 21 of the wall portion 11A and the second side 22 of the wall portion 11B of the jacket body 2 exhibit curved lines, while the third side 23 of the wall portion 11C and the fourth side 24 of the wall portion 11D exhibit straight lines.

In the first main joining step and the second main joining step of the third modification, friction stir joining is respectively performed on the first overlapped portion J1 and the second overlapped portion J2 using the main joining rotary tool F. In the first main joining step and the second main joining step, an amount of deformation of at least one of the jacket body 2 and the sealing body 3 is measured, and the friction stir joining is performed while the insertion depth of the tip-end-side pin F3 of the main joining rotary tool F being adjusted to the amount of deformation. That is, the main joining rotary tool F is moved so that the moving trajectory thereof exhibits a curved line or a straight line along the peripheral wall end surface 11a of the jacket body 2 and the front surface 3a of the sealing body 3. This makes the depth and width of the plasticized area W1 and W2 constant.

Thermal contraction may occur in the plasticized areas W1 and W2 due to the heat input from the friction stir joining, to deform portions, close to the sealing body 3, of the liquid-cooled jacket 1 in a concave shape. However, according to the first main joining step and the second main joining step of the third modification, since the jacket body 2 and the sealing body 3 are formed to be convex in advance, the liquid-cooled jacket 1 is made flat by way of thermal contraction after friction stir joining.

Furthermore, the curved surface KB2a of the spacer KB2 comes in surface contact with the concave back surface of the bottom portion 10 of the jacket body 2 in the third modification. This allows for performing friction stir joining while the jacket body 2 and the sealing body 3 being cooled more effectively. Since the frictional heat in the friction stir joining is kept at a low level, the deformation of the liquid-cooled jacket 1 caused by the thermal contraction is reduced. This allows for reducing the curvature of the jacket body 2 and the sealing body 3 when the jacket body 2 and the sealing body 3 are formed in a convex shape in the preparation step.

An amount of deformation of each of the jacket body 2 and the sealing body 3 may be measured by using a well-known height detection device. In addition, the main joining step may be performed while an amount of deformation of the jacket body 2 and the sealing body 3 being detected, for example, using a friction stir device equipped with a detection device for detecting the height from the table KB to at least one of the jacket body 2 and the sealing body 3.

Moreover, although the jacket body 2 and the sealing body 3 are curved in the third modification, so that the first side 21 and the second side 22 exhibit curved lines in the third modification, the present invention is not limited thereto. For example, the spacer KB2 having a spherical surface may be formed, and the back surface of the bottom portion 10 of the jacket body 2 may come in surface contact with the spherical surface. In this case, when the jacket body 2 is fixed to the table KB, all of the first side 21 to the fourth side 24 exhibit curved lines.

In addition, the height position of the tip-end-side pin F3 of the main joining rotary tool F is changed according to the amount of deformation of the jacket body 2 or the sealing body 3 in the third modification. However, the main joining step may be performed with the height of the tip-end-side pin F3 of the main joining rotary tool F with respect to the table KB kept constant.

Second Embodiment

Figure 25:
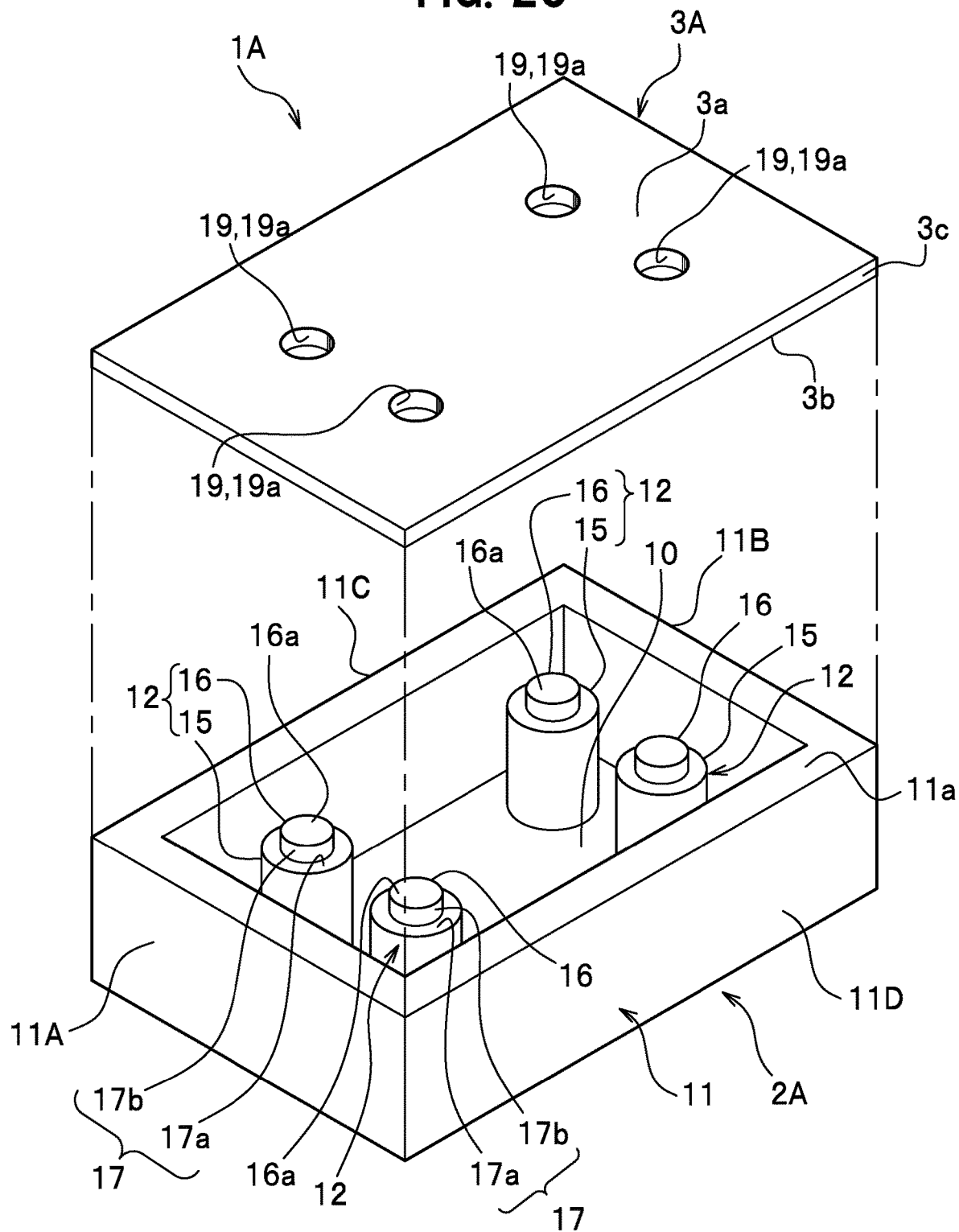
FIG. 25 is a disassembled perspective view of a liquid-cooled jacket according to the second embodiment.

Next, a method for manufacturing a liquid-cooled jacket according to a second embodiment of the present invention will be described. As shown in FIG. 25, the second embodiment is different from the first embodiment in that the support column 12 has a support column step portion 17 formed. The method for manufacturing a liquid-cooled jacket according to the second embodiment will be described focusing on differences from the first embodiment.

A liquid-cooled jacket 1A according to the second embodiment is composed of a jacket body 2A and a sealing body 3A. The jacket body 2A is a box-like body whose upper side is open. The jacket body 2A includes the bottom portion 10, the peripheral wall portion 11, and a plurality of the support columns 12. The jacket body 2A is appropriately selected from metals which may be frictionally stirred such as aluminum, aluminum alloy, copper, copper alloy, titanium, titanium alloy, magnesium and magnesium alloy. In the present embodiment, the jacket body 2A is formed of an aluminum alloy of the same material type as the sealing body 3A, but an aluminum alloy cast material (for example, JIS AC4C, ADC12 or the like) may be used. The bottom portion 10 has a rectangular shape in a planar view. The peripheral wall portion 11 is composed of the wall portions 11A, 11B, 11C, and 11D having the same plate thickness.

The support column 12 rises from the bottom portion 10 and has a cylindrical shape. The number of the support columns 12 may be any number as long as being one or more, but in the present embodiment, four support columns are formed. The shapes of the support columns 12 are all the same. The support column 12 includes a large diameter portion 15 and a small diameter portion 16. A support column step portion 17 is formed with the step between the large diameter portion 15 and a small diameter portion 16. The support column step portion 17 has a step bottom surface 17a and a step side surface 17b rising from the step bottom surface 17a. The step bottom surface 17a has at the same height as the peripheral wall end surface 11a of the peripheral wall portion 11. The height of the step side surface 17b is the same as the thickness of the plate of the sealing body 3.

The sealing body 3A is a plate-like member having a rectangular shape in a planar view. The sealing body 3A has the same shape in a planar view as that of the jacket body 2A. In the present embodiment, the material of the sealing body 3A is formed of an aluminum alloy of the same material type as the jacket body 2A, but a wrought aluminum alloy material (for example, JIS A1050, A1100, A6063 etc.) may be used. The sealing body 3A is formed with four holes 19 corresponding to the support columns 12 respectively. The small diameter portions 16 of the support columns 12 are inserted to the holes 19 respectively.

Figure 26:
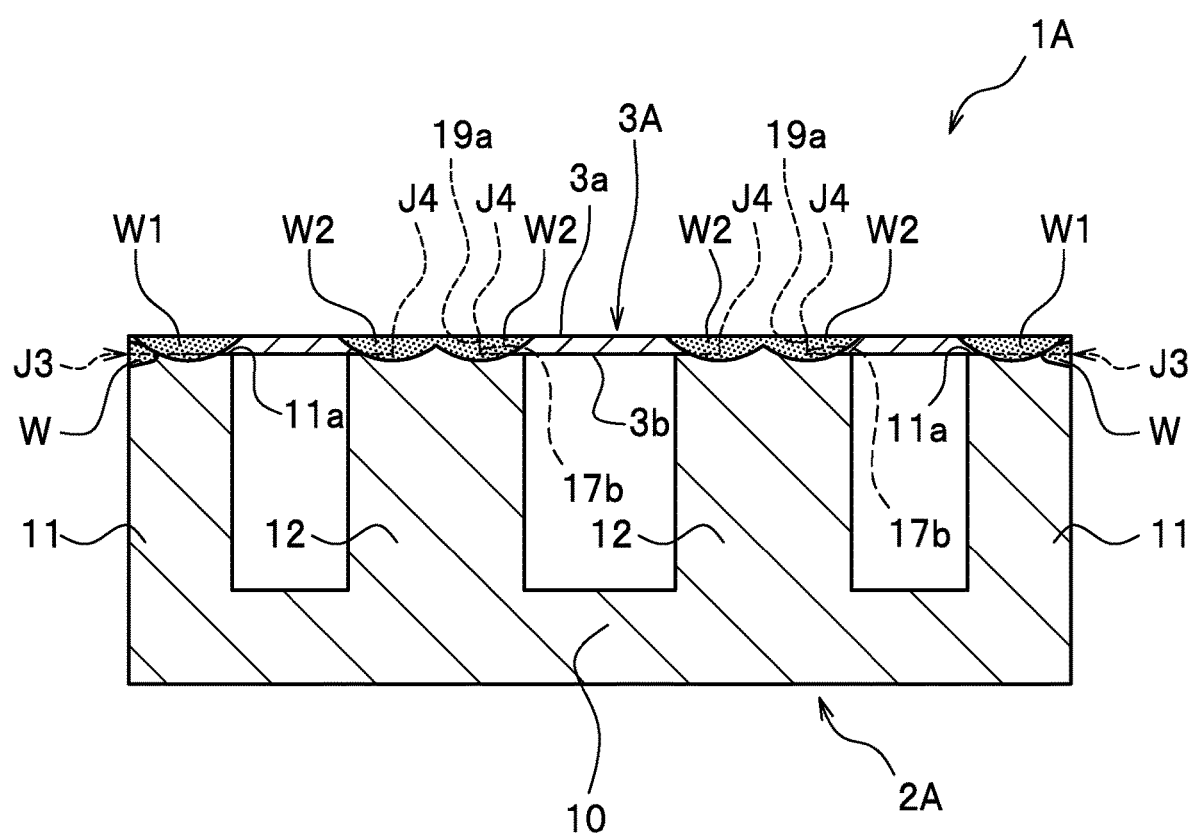
FIG. 26 is a cross-sectional view of the liquid-cooled jacket according to the second embodiment.

As shown in FIG. 26, the jacket body 1A is joined and integrated with the sealing body 3A by friction stirring as the liquid-cooled jacket 1A. Overlapped portions J3 in which the peripheral wall end surface 11a of the peripheral wall 11 is overlapped with the back surface 3b of the sealing body 3A, and four abutted portions J4 in which hole walls 19a of the holes 19 are abutted against the step side surface 17b of the support column step portion 17, are respectively joined by friction stirring. The plasticized areas W, W1 are formed in the overlapped portion J3, and a plasticized area W2 is formed in the overlapped portion J4. The liquid-cooled jacket 1A has a hollow portion formed therein, in which a heat transferring fluid for transferring heat to the outside flows.

Next, a method for manufacturing a liquid-cooled jacket (a method for manufacturing a liquid-cooled jacket with heating elements) according to a second embodiment will be described. In the method for manufacturing a liquid-cooled jacket, a preparation step, a placing step, a fixing step, a provisional joining step, a first main joining step, a second main joining step, a drilling step, a burr removing step and a mounting step are performed.

The preparation step is a step of forming the jacket body 2A and the sealing body 3A, as shown in FIG. 25. The jacket body 2A is formed by die casting, for example.

Figure 27:
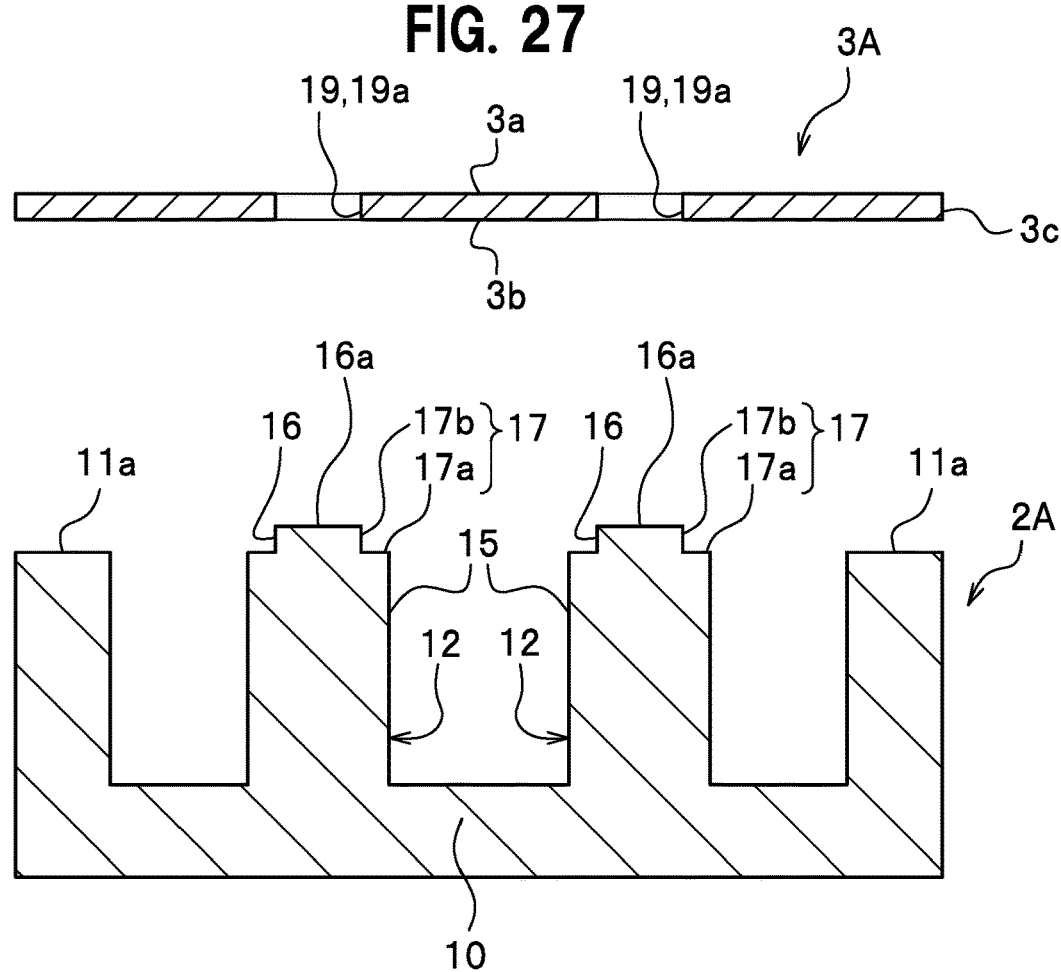
FIG. 27 is a cross-sectional view of the liquid-cooled jacket before the placing step of the method for manufacturing the liquid-cooled jacket according to the second embodiment.
Figure 28:
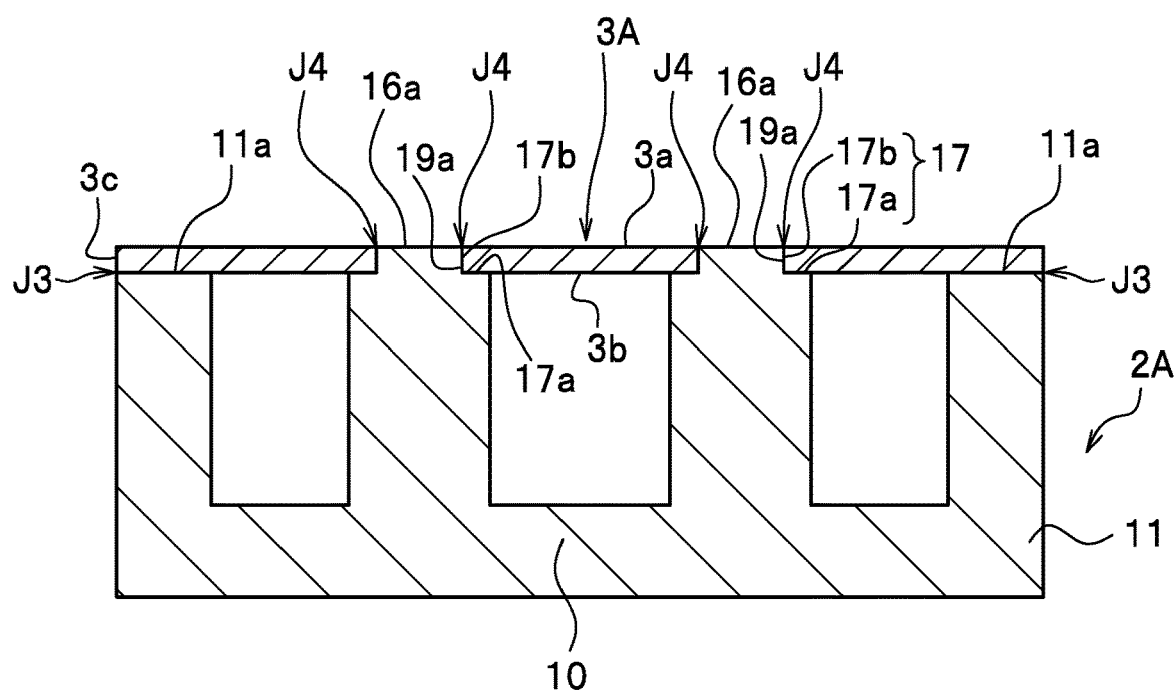
FIG. 28 is a cross-sectional view of the liquid-cooled jacket after the placing step of the method for manufacturing the liquid-cooled jacket according to the second embodiment.

The placing step is a step of placing the sealing body 3A on the jacket body 2A while the small diameter portions 16 of the support column 12 are inserted to the holes 19 of the sealing body 3A, as shown in FIGS. 27 and 28. The back surface 3b of the sealing body 3A comes in surface contact with the peripheral wall end surface 11a of the peripheral wall 11 and the step bottom surface 17a of the support column step portion 17, respectively. In the placing step, the peripheral wall end surface 11a of the peripheral wall portion 11 is abutted against the back surface 3b of the sealing body 3A to form the overlapped portion J3. Furthermore, in the placing step, the step side surface 17b of the support column step portion 17 is abutted with the hole walls 19a of the holes 19 to form the abutted portion J4. In addition, in the placing step, the support column end surface 16a is flush with the front surface 3A of the sealing body 3A.

In the fixing step, the jacket body 2A and the sealing body 3A are fixed to a table (not shown). The jacket body 2A is immovably restrained to the table by a fixing jig such as a clamp.

Figure 29:
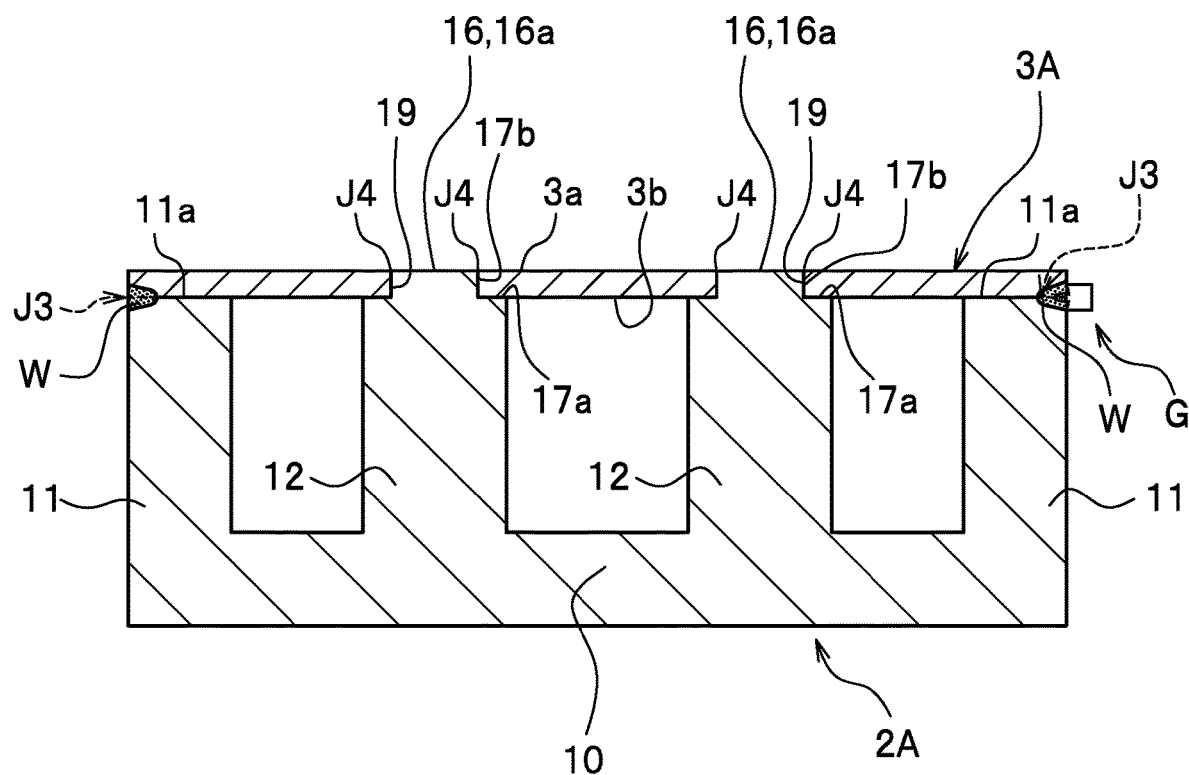
FIG. 29 is a cross-sectional view of the liquid-cooled jacket in the provisional joining step of the method for manufacturing the liquid-cooled jacket according to the second embodiment.

The provisional joining step is a step of provisionally joining the jacket body 2A with the sealing body 3A, as shown in FIG. 29. The provisional joining step is the same as that of the first embodiment, and thus the description thereof is omitted.

Figure 30:
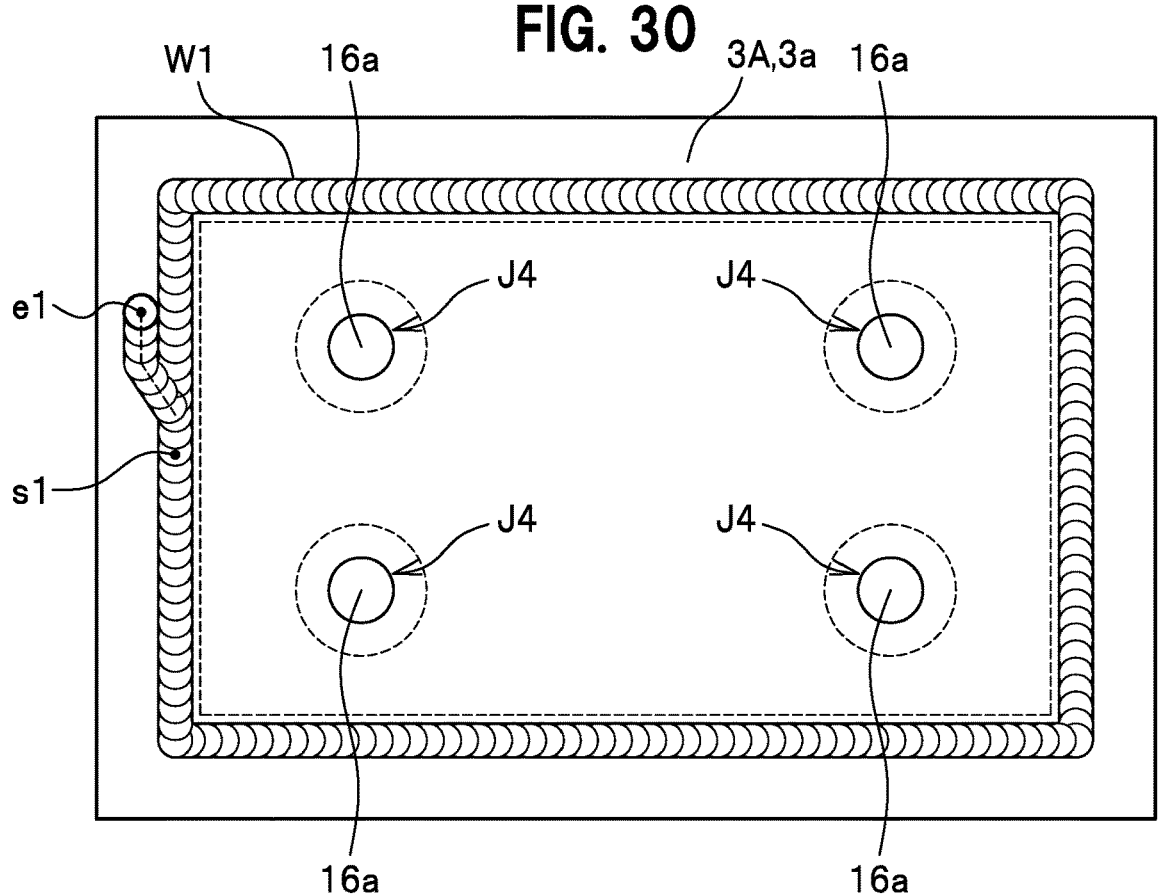
FIG. 30 is a plan view of the liquid-cooled jacket in the first main joining step of the method for manufacturing the liquid-cooled jacket according to the second embodiment.
Figure 31:
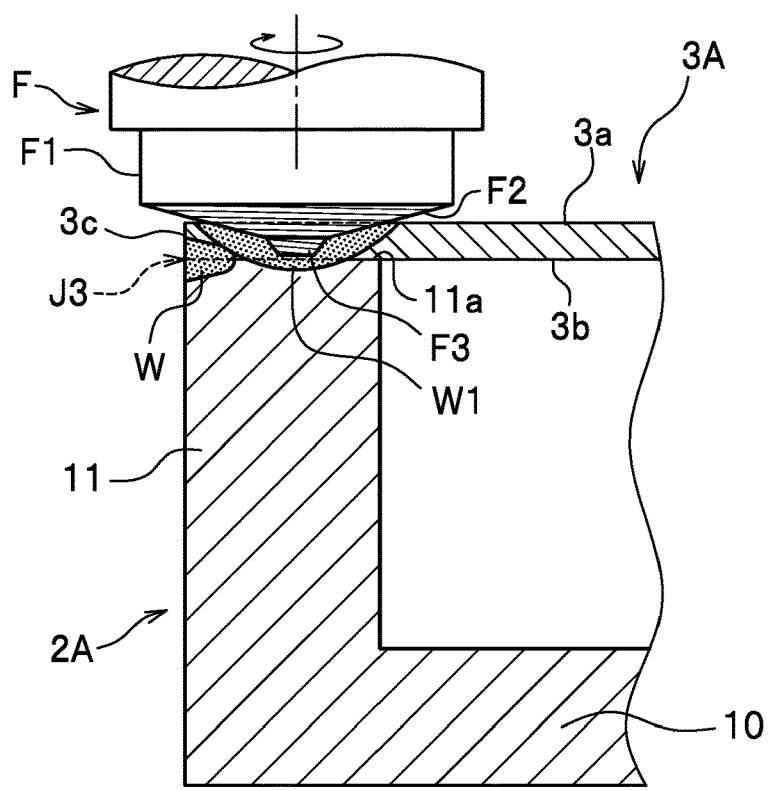
FIG. 31 is a cross-sectional view of the liquid-cooled jacket in FIG. 30 in the first main joining step of the method for manufacturing the liquid-cooled jacket according to the second embodiment.

The first main joining step is a step of performing friction stir joining to the overlapped portion J3 by using the main joining rotary tool F, as shown in FIGS. 30 and 31. The first main joining step is the same as that of the first embodiment, and thus the description thereof is omitted.

Figure 32:
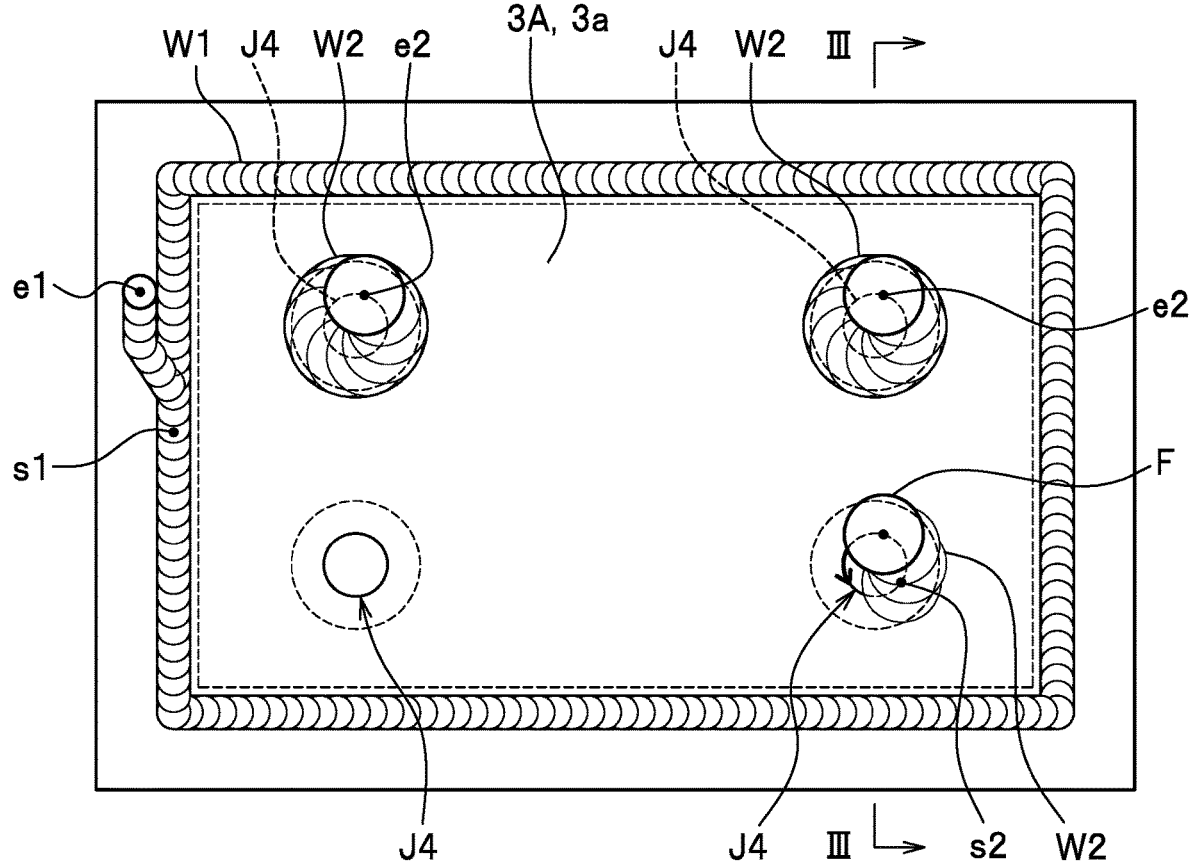
FIG. 32 is a plan view of the liquid-cooled jacket in the second main joining step of the method for manufacturing the liquid-cooled jacket according to the second embodiment.
Figure 33:
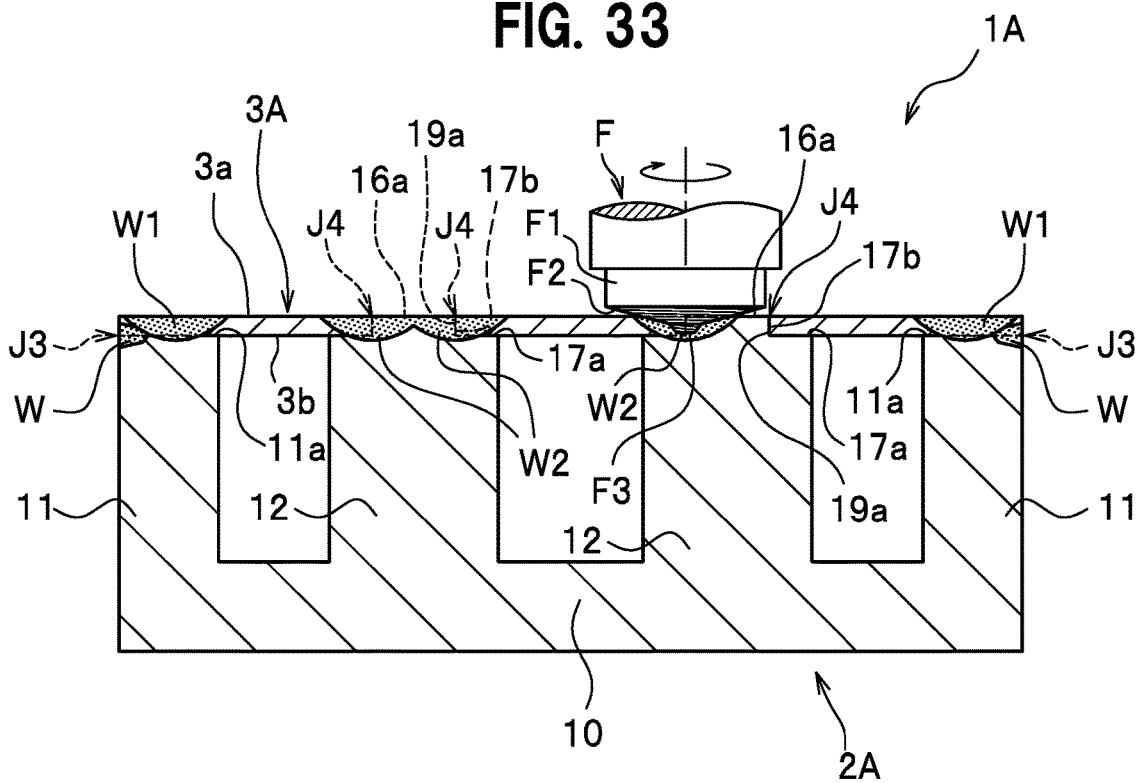
FIG. 33 is a cross-sectional view taken along a line III-III in FIG. 32 showing the liquid-cooled jacket in second main joining step of the method for manufacturing the liquid-cooled jacket according to the second embodiment.

The second main joining step is a step of performing friction stir joining to the abutted portions J4 by using the main joining rotary tool F respectively, as shown in FIGS. 32 and 33. In the second main joining step, the main joining rotary tool F rotated clockwise is inserted into arbitrary start position s2 of the abutted portion J4, and the main joining rotary tool F is moved counterclockwise along the abutted portion J4. With the second main joining step, a plasticized area W2 is formed in the abutted portion J4.

In the second main joining step, friction stirring is performed with the tip-end-side pin F3 and the base-end-side pin F2 brought in contact with the sealing body 3A and the support column 12 of the jacket body 2A, as shown in FIG. 33. In the second main joining step, friction stir joining is performed while the support column end surface 16a of the support column 12 and the surface 3a of the sealing body 3A being pressed by the outer circumferential surface of the base-end-side pin F2 of the main joining rotary tool F. The insertion depth of the main joining rotary tool F is set so that at least the plasticized area W2 reaches the step bottom surface 17a, and that at least a part of the base-end-side pin F2 comes in contact with the support column end surface 16a of the support column 12 and the front surface 3a of the sealing body 3. In the present embodiment, the insertion depth is set so that the tip of the tip-end-side pin F3 does not reach the step bottom surface 17a of the support column step portion 17 and that the central portion in the height direction of the outer circumferential surface of the base-end-side pin F2 or around comes in contact with the support column end surface 16a of the support column 12 and the front surface 3a of the sealing body 3. Then, the main joining rotary tool F is moved like tracing the abutted portion J4 with the height position of the tool F kept constant.

Note that the insertion depth of the main joining rotary tool F may not be necessarily constant. For example, the insertion depth may be changed between the first main joining step and the second main joining step. In addition, the insertion depth of the main joining rotary tool F may be set so that the tip of the tip-end-side pin F3 reaches the step bottom surface 17a of the support column step portion 17. At this time, the plastically fluidized material needs to be prevented from flowing out to the inside of the liquid-cooled jacket 1A.

In the second main joining step, in the case of the main joining rotary tool F being moved counterclockwise with respect to the support column 12 as in the present embodiment, it is preferable to rotate the main joining rotary tool F clockwise. On the other hand, in the case of the main joining rotary tool F being moved clockwise with respect to the support column 12, it is preferable to rotate the main joining rotary tool F counterclockwise. By setting the moving direction and the rotating direction of the main joining rotary tool F as described above, a joining defect due to friction stir joining, even if formed, is formed on the side closer to the support column 12, having a relatively large thickness, and at a position away from the hollow portion of the liquid-cooled jacket 1A, to allow for preventing the decrease in water tightness and airtightness.

As shown in FIG. 32, the main joining rotary tool F is moved around along the abutted portion J4, and further moved to pass through the starting position s2. Then, the main joining rotary tool F is moved to the end position e2 set on abutted portion J4, and when the main joining rotary tool F reaches ending position e2, the main joining rotary tool F is moved upward to separate the main joining rotary tool F from the abutted portion J4.

If a removal trace remains in the abutted portion J4 after the main joining rotary tool F is separated from the abutted portion J4, a repair step may be performed to repair the removal trace. In the repair step, for example, overlay welding may be performed to fill the weld metal in the removal trace for repair, for example. This makes front surface 3a of the sealing body 3A and the support column end surface 16a of the support column 12 becomes flat.

Note that when the main joining rotary tool F is separated from the abutted portion J4, the main joining rotary tool F may be moved toward the center of the support column 12 for separation on the support column 12. Alternatively, when the main joining rotary tool F is separated from the abutted portion J4, for example, the main joining rotary tool F may be gradually moved upward while the main joining rotary tool F being moved on the abutted portion J4 or the support column end surface 16a, for example, so that the insertion depth of the main joining rotary tool F is gradually reduced. By doing so, the removal trace after the second main joining step is prevented from remaining on the front surface 3a of the sealing body 3A and the support column end surface 16a of the support column 12, or is reduced in size.

Figure 34:
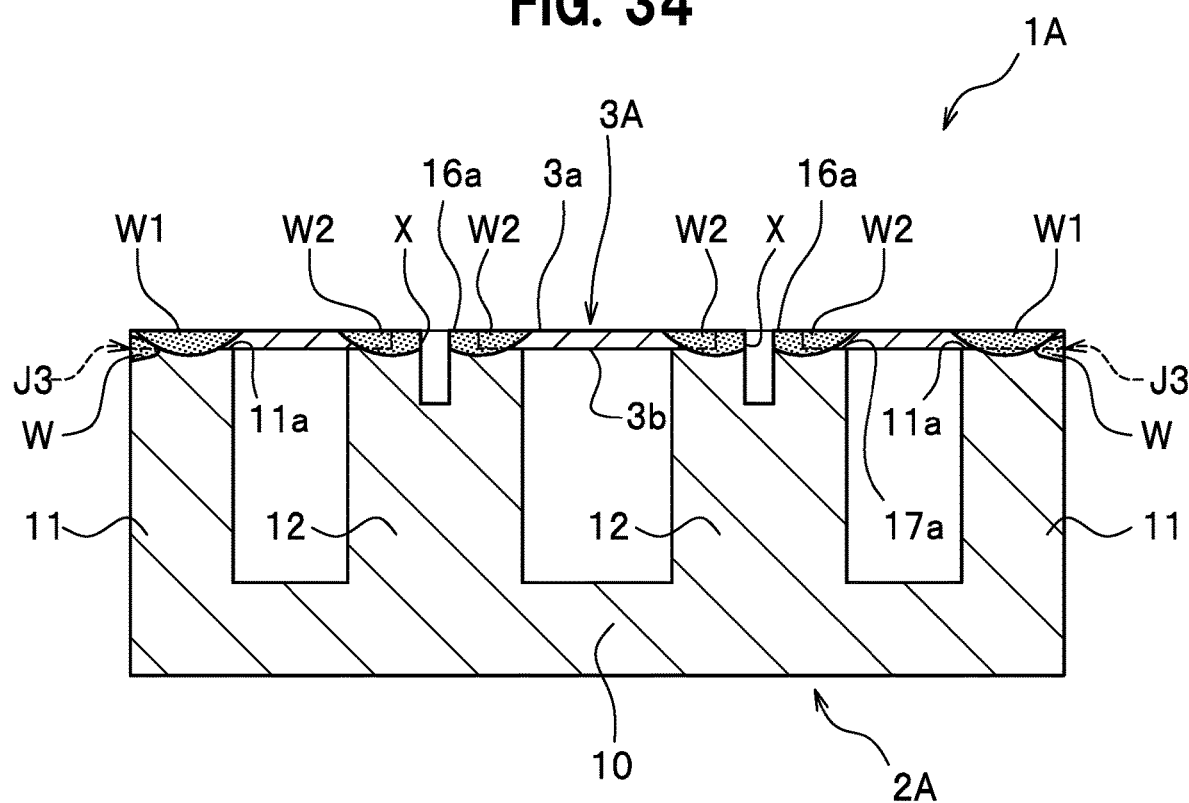
FIG. 34 is a cross-sectional view of the liquid-cooled jacket in the drilling step of the method for manufacturing the liquid-cooled jacket according to the second embodiment.

The drilling step is a step of forming a fixing holes X which communicates the sealing body 3A with the support column 12 and is for fixing the heating element H, as shown in FIG. 34. The fixing hole X is formed so as to penetrate a part of the plasticized area W2 to reach the support column 12.

In the burr removing step, the burrs exposed on the surfaces of the jacket body 2A and the sealing body 3A with the first main joining step, the second main joining step, and the drilling step, are removed. This allows for finishing the surfaces of the jacket body 2A and the sealing body 3A clean.

Figure 35:
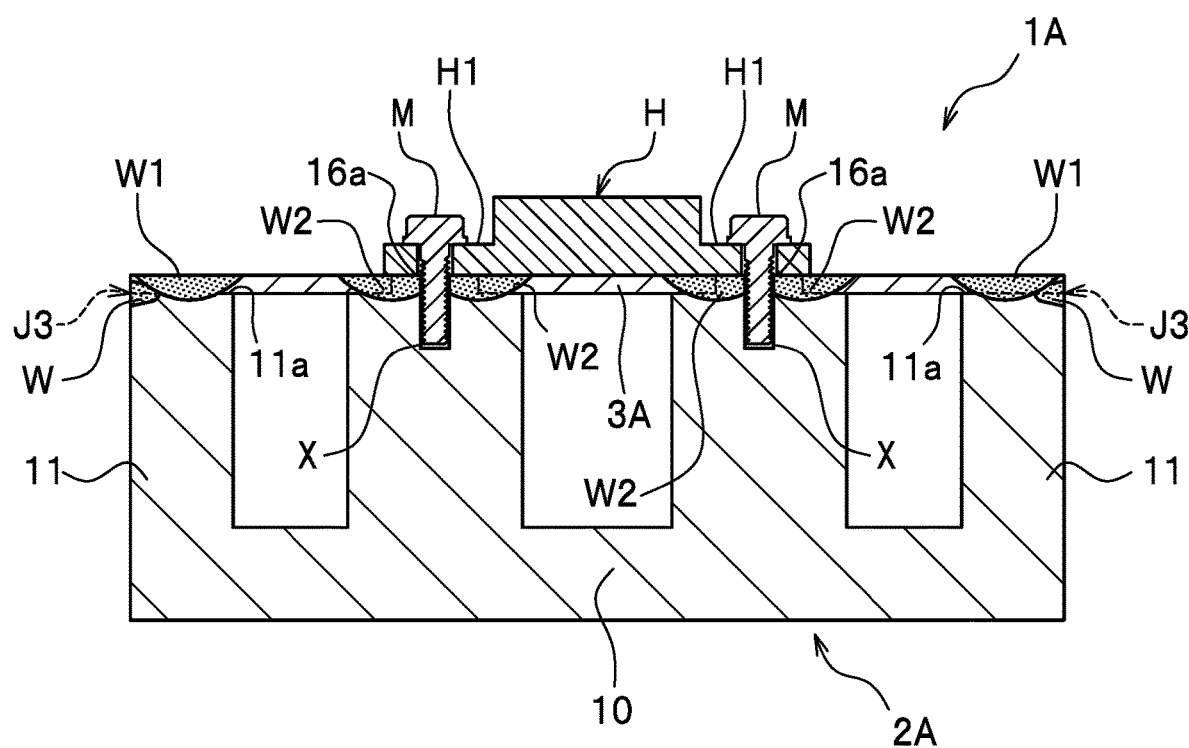
FIG. 35 is a cross-sectional view of the liquid-cooled jacket in the placing step of the method for manufacturing the liquid-cooled jacket according to the second embodiment.

The mounting step is a step of mounting the heating element H by means of the mounting member M, as shown in FIG. 35. When the heating element H is mounted, the through hole formed in the flange H1 of the heating element H and the fixing hole X are communicated with each other and the heating element is fixed by the mounting member M such as a screw. The mounting member M is inserted to reach the support column 12.

Note that, the fixing hole X is formed on the sealing body 3A side in the present embodiment to fix the heating element H to the sealing body 3A. However, the heating element H may be fixed to the bottom portion 10 by forming a hole in the bottom portion 10 to communicate with the bottom portion 10 and the support column 12. The heating element H may be mounted to at least one of the sealing body 3A and the bottom portion 10. Moreover, although the fixing hole X is formed in the present embodiment, the heating element H may be fixed with the mounting member M without forming the fixing hole X.

Approximately the same advantageous effects as with the first embodiment may be also obtained by the method for manufacturing a liquid-cooled jacket described above.

In addition, according to the method for manufacturing a liquid-cooled jacket of the present embodiment, the sealing body 3a is prevented from displacing the position by performing a provisional joining step before the first main joining step when the first main joining step and the second main joining step are performed.

Furthermore, in the present embodiment, since the support column 12 (support column end surface 16a) is exposed on the front surface 3a of the sealing body 3 in the present embodiment, the drilling step of drilling the fixing hole X and the mounting step of mounting the heating element H are easily performed. Moreover, since the support column 12 is brought into direct contact with the heating element H, the cooling efficiency is further enhanced.

Note that, the provisional joining step may be performed to at least one of the overlapped portion J3 or the abutted portion J4. In addition, for example, in the second embodiment, the liquid-cooled jacket 1A may be manufactured by employing the manufacturing methods of the first to third modifications described above.

Although the embodiments and modifications of the present invention have been described above, design may be changed as appropriate. For example, fins may be formed on at least one of the jacket body and the sealing body. In addition, the main joining rotary tool F may be moved two rounds along the first overlapped portion J1. In addition, the rotary tools used in the first main joining step and the second main joining step may be different from each other. Moreover, although the present invention is applied to the method for manufacturing the liquid-cooled jacket having the heating element H attached thereto in the embodiments, the present invention may be also applied to the method for manufacturing the liquid-cooled jacket without attaching heating element H thereto. In this case, the drilling step and the mounting step are omitted.

Furthermore, in the provisional joining step of the present embodiment, although the compact provisional joining rotary tool is used, the main joining rotary tool may be used. In this case, it is preferable that the plastically fluidized area W formed in the provisional joining step is overlapped with the plastically fluidized area W1 formed in the first main joining step. Thereby, water tightness and airtightness are improved.

Figure 36:
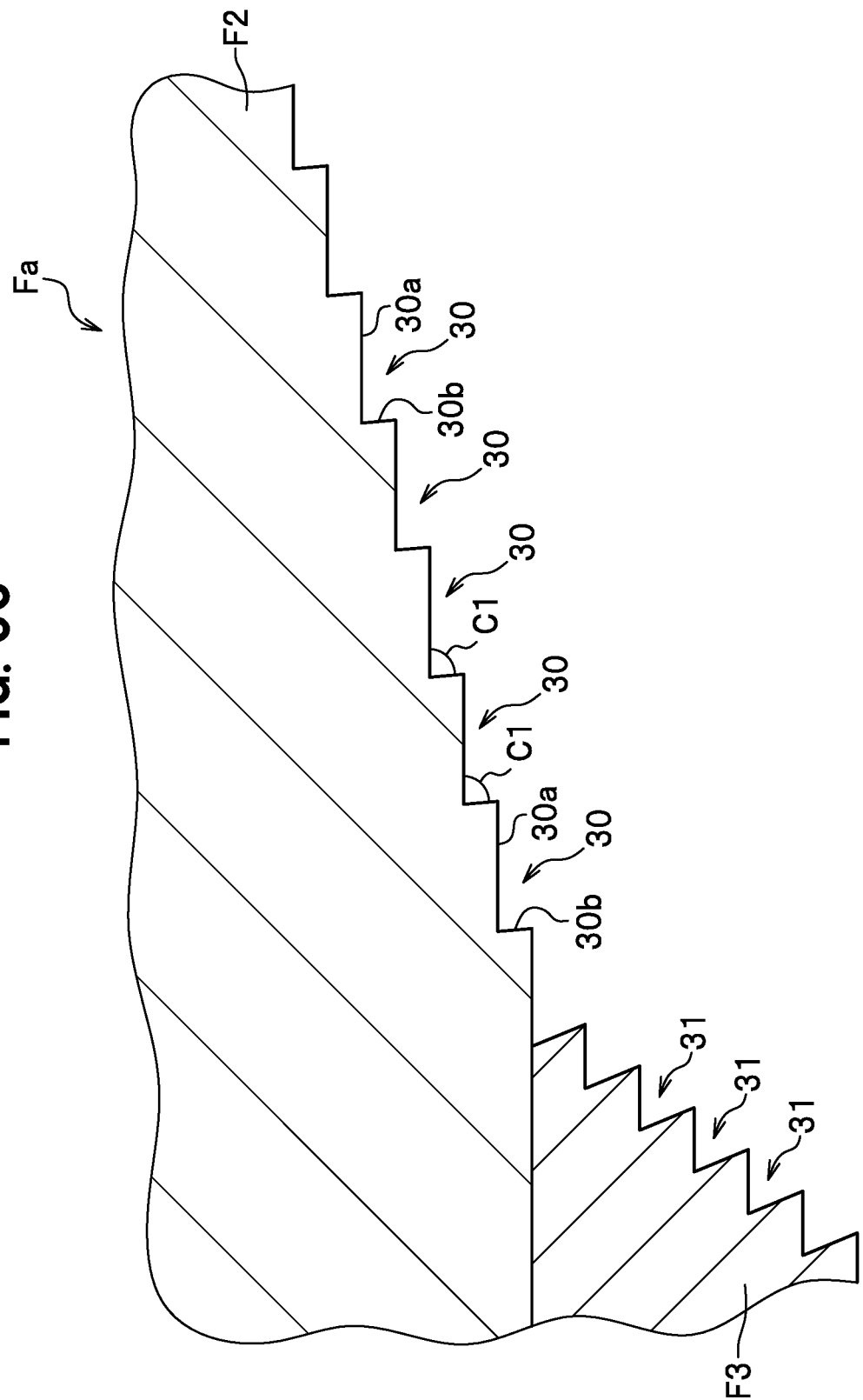
FIG. 36 is a cross-sectional view of the first modification of the main joining rotary tool.

The design of the main joining rotary tool F of the present invention may be changed as appropriate. FIG. 36 is a side view of the first modification of the main joining rotary tool of the present invention. As shown in FIG. 36, in a main joining rotary tool Fa according to the first modification, a step angle C1 between the step bottom surface 30a and the step side surface 30b of the pin step portion 30 is 85°. The step bottom surface 30a is parallel to the horizontal plane. In this way, the step bottom surface 30a is parallel to the horizontal plane, and the step angle C1 may be an acute angle within a range in which the plastically fluidized material is pushed out without staying in and adhering to the pin step portion 30 during friction stirring.

Figure 37:
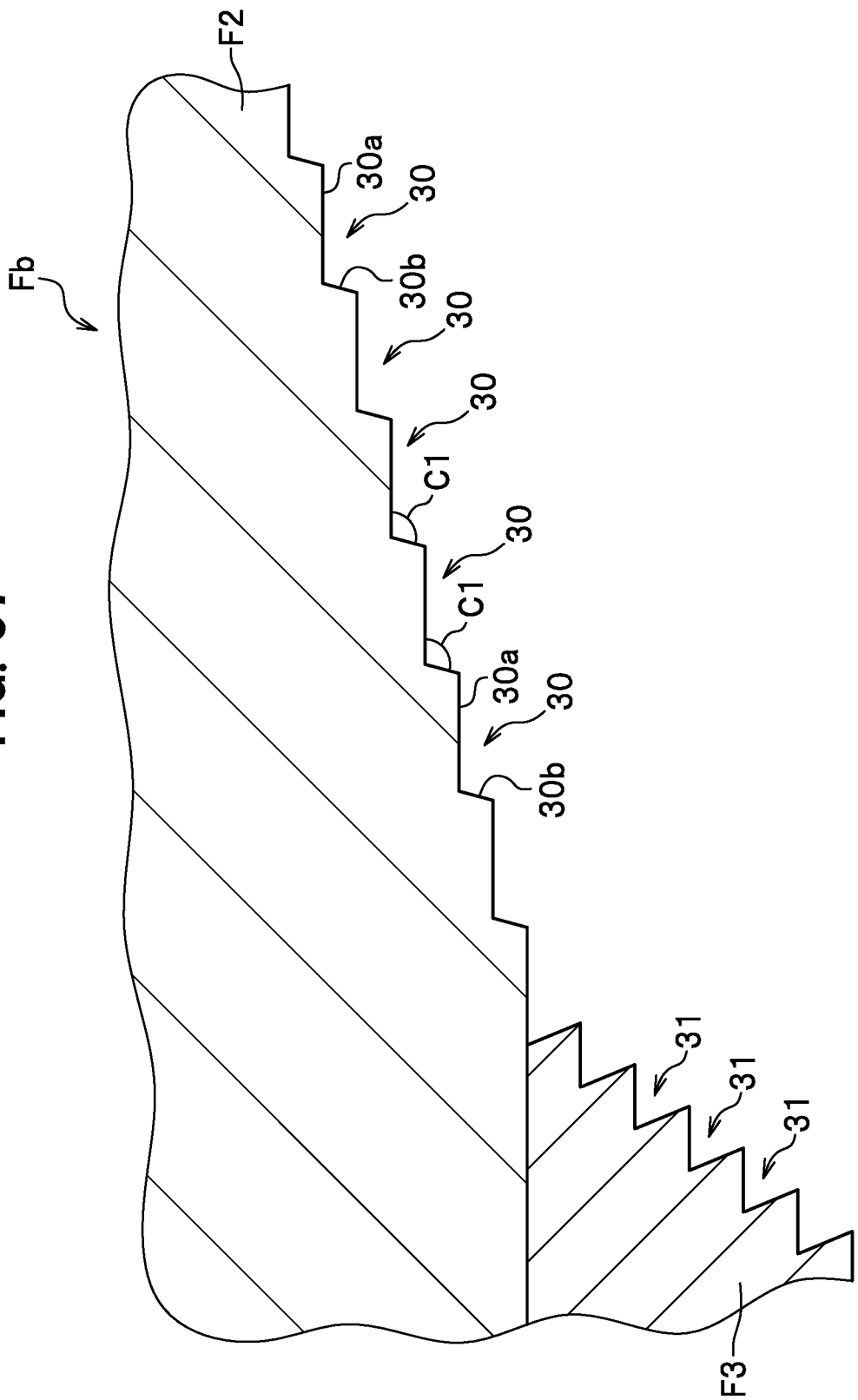
FIG. 37 is a cross-sectional view of the second modification of the main joining rotary tool.

FIG. 37 is a side view of the second modification of the main joining rotary tool of the present invention. As shown in FIG. 37, in the case of a main joining rotary tool Fb according to the second modification, the step angle C1 of the pin step portion 30 is 115°. The step bottom surface 30a is parallel to the horizontal plane. In this way, the step bottom surface 30a is parallel to the horizontal plane, and the step angle C1 may be an obtuse angle within a range of allowing for functioning as the pin step portion 30.

Figure 38:
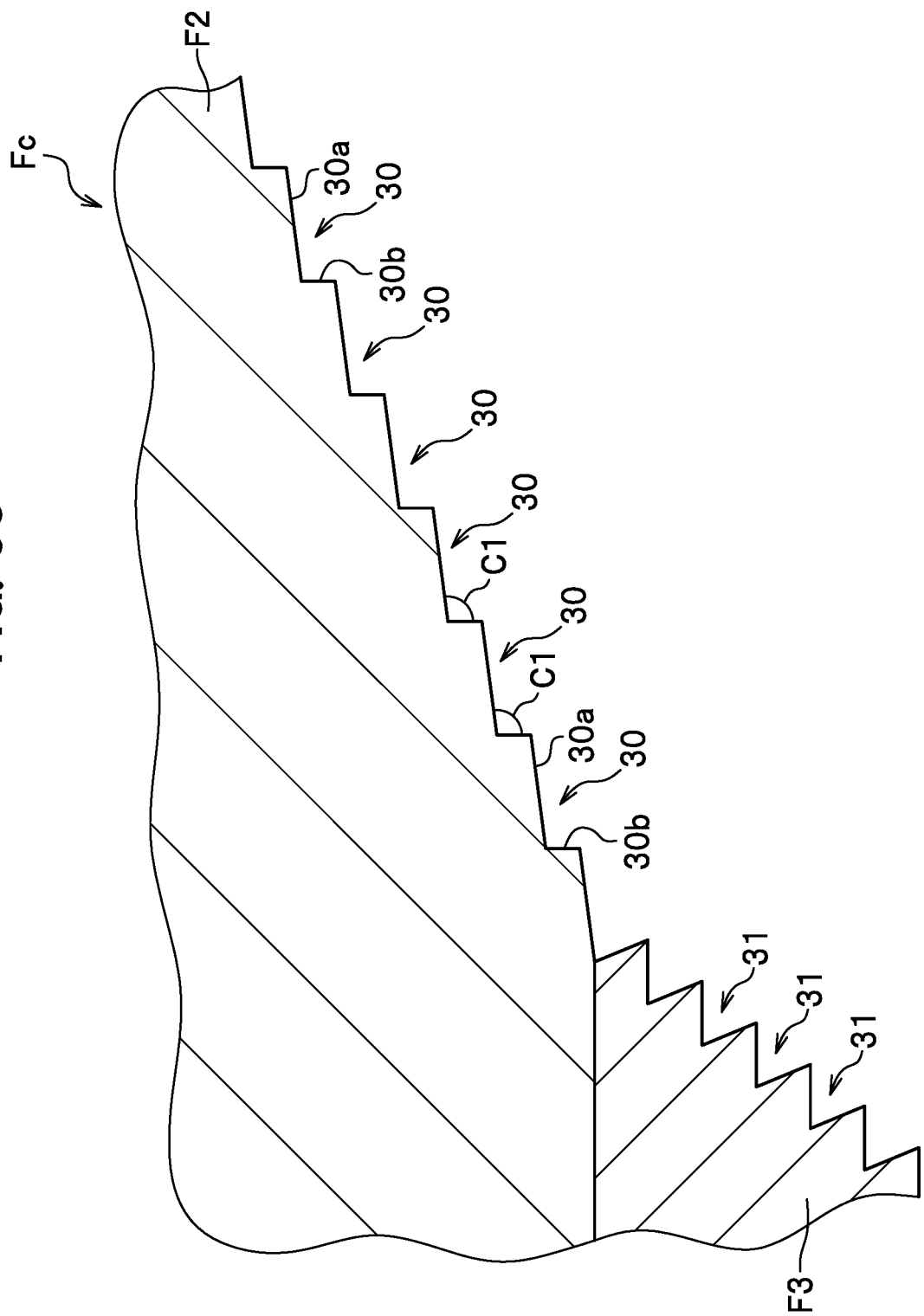
FIG. 38 is a cross-sectional view of the third modification of the main joining rotary tool.

FIG. 38 is a side view of the third modification of the main joining rotary tool of the present invention. As shown in FIG. 38, in the case of a main joining rotary tool Fc according to the third modification, the step bottom surface 30a is inclined 10° upward with respect to the horizontal plane at an angle of, radially outward from the rotation axis of the tool. The step side surface 30b is parallel to the vertical plane. In this way, the step bottom surface 30a may be formed so as to be inclined upward to the horizontal plane in, radically outward from the rotation axis of the tool, as long as the plastically fluidized material is pressed during the friction stirring. The same advantageous effects as those of the present embodiment are also achieved by the first to third modifications of the rotary tool for the main joining described above.

DESCRIPTION OF REFERENCE NUMERALS 1 liquid-cooled jacket
1A liquid-cooled jacket
2 jacket body
2A jacket body
3 sealing body
3A sealing body
3a front surface
3b back surface
3c outer peripheral side surface
10 bottom portion
11 peripheral wall portion
11A wall portion
11B wall portion
11C wall portion
11D wall portion
11a peripheral wall end surface
12 support column
12a support column end surface
13 recess
16a support column end surface
17 support column step portion
17a step bottom surface
17b step side surface
F main joining rotary tool (rotary tool)
Fa main joining rotary tool
Fb main joining rotary tool
Fc main joining rotary tool
F1 base portion
F2 base-end-side pin
F3 tip-end-side pin
30 pin step portion
30a step bottom surface
30b step side surface
31 spiral groove
A1 taper angle (of a base-end-side pin)
A2 taper angle
C1 step angle
C2 spiral angle
Z1 distance (to a base-end-side pin)
Z2 distance
Y1 height (at a step side surface)
Y2 height
G provisional joining rotary tool
J1 first overlapped portion
J2 second overlapped portion J3 overlapped portion
J4 abutted portion
J5 second overlapped portion
K table (cooling plate)
M fastening member
W1 plasticized area
W2 plasticized area
WP cooling pipe

What is claimed is:

1. A method for manufacturing a liquid-cooled jacket configured with:
    a jacket body having a bottom portion, a peripheral wall portion rising from a peripheral edge of the bottom portion and a support column rising from the bottom portion; and a sealing body sealing an opening of the jacket body, wherein the jacket body and the sealing body are joined by friction stirring, the method including:
    a preparation step of forming a support column end surface of the support column at the same height position as a peripheral wall end surface of the peripheral wall portion,
    a placing step of placing the sealing body on the jacket body;
    a first main joining step of performing friction stirring by moving a rotary tool around to a first overlapped portion where a peripheral wall end surface of the peripheral wall portion is overlapped with the back surface of the sealing body; and
    a second main joining step of performing friction stirring to a second overlapped portion where the support column end surface of the support column is overlapped with the back surface of the sealing body while the rotary tool is inserted from the surface of the sealing body, wherein
    the rotary tool is a main joining rotary tool for friction stirring having a base-end-side pin and a tip-end-side pin,
    a taper angle of the base-end-side pin is 135 to 160 degrees and greater than a taper angle of the tip-end-side pin and a pin step portion is formed in an outer circumferential surface of the base-end-side pin, and
    wherein a spiral groove is formed on an outer circumferential surface of the tip-end-side pin in a plurality of revolutions including at least:
    a first revolution at a widest portion of the tip-end-side pin,
    a final revolution at a narrowest portion of the tip-end-side pin, and
    an intermediate revolution between the first revolution and the final revolution, the spiral groove including a spiral bottom surface and a spiral side surface such that:
    the spiral bottom surface of the first revolution adjoins the spiral side surface of the intermediate revolution, and
    the spiral bottom surface of the intermediate revolution adjoins the spiral side surface of the final revolution,
    wherein the spiral bottom surface and spiral side surface of each revolution form a spiral angle and the spiral angle is 45 to 90 degrees,
    and
    wherein friction stirring is performed in the first main joining step and the second main joining step under the condition that the tip-end-side pin comes in contact with both of the jacket body and the sealing body or the sealing body only and the base-end-side pin comes in contact with the sealing body.

2. The method for manufacturing a liquid-cooled jacket as claimed in claim 1, comprising a provisional joining step of provisionally joining at least any one of the first overlapped portion and the second overlapped portion prior to the first main joining step and the second main joining step.

3. The method for manufacturing a liquid-cooled jacket as claimed in claim 1, wherein,
    the preparation step includes forming the jacket body by die casting, so as to have the bottom portion convex toward the front surface, and to have the sealing body convex toward the front surface.

4. The method for manufacturing a liquid-cooled jacket as claimed in claim 3, wherein
    the deformation amount of the jacket body is measured in advance, and the friction stirring is performed while the insertion depth of the rotary tool being adjusted to the deformation amount in the first main joining step and the second main joining step.

5. The method for manufacturing a liquid-cooled jacket as claimed in claim 1, wherein a cooling plate in which a cooling medium flows is disposed on the back surface of the bottom portion and the friction stirring is performed while the jacket body and the sealing body being cooled, in the first main joining step and the second main joining step.

6. The method for manufacturing a liquid-cooled jacket as claimed in claim 5, wherein the front surface of the cooling plate comes in surface contact with the back surface of the bottom portion.

7. The method for manufacturing a liquid-cooled jacket as claimed in claim 5, wherein the cooling plate has a cooling flow passage in which the cooling medium flows, and the cooling flow passage has a planar shape to follow a moving trajectory of the rotary tool, in the first main joining step.

8. The method for manufacturing a liquid-cooled jacket as claimed in claim 5, wherein the cooling flow passage in which the cooling medium flows is composed of a cooling pipe embedded in the cooling plate.

9. The method for manufacturing a liquid-cooled jacket as claimed in claim 1, wherein the friction stirring is performed in the first main joining step and the second main joining step, while a cooling medium being flowed in a hollow portion composed of the jacket body and the sealing body to cool the jacket body and the sealing body.

10. The method for manufacturing a liquid-cooled jacket as claimed in claim 1,
    wherein the pin step portion of the base-end-side pin is spiral in a plan view and stepwise in a side view,
    wherein the pin step portion is formed of a step bottom surface and a step side surface, the step bottom surface being formed in a circumferential direction from an axis of the rotary tool,
    wherein an angle defined by the step bottom surface and the step side surface is 85 to 120 degrees, and
    wherein the step bottom surface of the pin step portion adjoins the step side surface of the pin step portion at an outer side of the base-end-side pin, and the step side surface of the pin step portion adjoins the step bottom surface of the pin step portion at an inner side of the base-end-side pin.

11. The method for manufacturing a liquid-cooled jacket as claimed in claim 1, wherein the intermediate revolution between the first revolution and the final revolution comprises at least one revolution.

12. The method for manufacturing a liquid-cooled jacket as claimed in claim 1, wherein the intermediate revolution between the first revolution and the final revolution comprises a plurality of revolutions.

\* \* \* \* \*